United States Patent [19]

Garshelis

[11] Patent Number: 5,591,925
[45] Date of Patent: Jan. 7, 1997

[54] CIRCULARLY MAGNETIZED NON-CONTACT POWER SENSOR AND METHOD FOR MEASURING TORQUE AND POWER USING SAME

[76] Inventor: Ivan J. Garshelis, 176 S. Mountain Rd., Pittsfield, Mass. 01201

[21] Appl. No.: 394,001

[22] Filed: Feb. 24, 1995

Related U.S. Application Data

[63] Continuation-in-part of Ser. No. 253,022, Jun. 2, 1994, Pat. No. 5,520,059, which is a continuation-in-part of Ser. No. 736,299, Jul. 29, 1991, Pat. No. 5,351,555.

[51] Int. Cl.⁶ ............................................. G01L 3/02
[52] U.S. Cl. ........................... 73/862.335; 73/862.333; 324/207.13
[58] Field of Search ................. 73/862.333, 862.334, 73/862.335, 862.336; 324/207.13; 336/30

[56] References Cited

U.S. PATENT DOCUMENTS

| | | | |
|---|---|---|---|
| 2,287,796 | 6/1942 | Hall | 73/862.325 |
| 2,365,073 | 12/1944 | Haight | 73/862.28 |
| 2,365,565 | 12/1944 | Langer | 73/862.28 |
| 2,511,178 | 6/1950 | Roters | 73/862.333 |
| 2,521,905 | 9/1950 | Feller | 73/862.333 |
| 3,939,448 | 2/1976 | Garshelis | 335/215 |
| 4,364,278 | 12/1982 | Horter et al. | 73/862.335 |
| 4,523,482 | 6/1985 | Barkhoudarian | 73/862.336 |
| 4,627,298 | 12/1986 | Sahashi et al. | 73/862.336 |
| 4,656,875 | 4/1987 | Uitermarkt | 73/862.335 |
| 4,760,745 | 8/1988 | Garshelis | 73/862.336 X |
| 4,805,466 | 2/1989 | Schiessle et al. | 73/862.336 |
| 4,882,936 | 11/1989 | Garshelis | 73/862.336 X |
| 4,891,992 | 1/1990 | Kodayashi et al. | 73/862.335 |
| 4,896,544 | 1/1990 | Garshelis | 73/862.336 X |
| 4,899,598 | 2/1990 | Gumaste et al. | 73/862.335 |
| 5,052,232 | 10/1991 | Garshelis | 73/862.336 X |
| 5,182,953 | 2/1993 | Ellinger et al. | 73/862.335 |
| 5,386,733 | 2/1995 | Hesthamar et al. | 73/862.333 |

FOREIGN PATENT DOCUMENTS

| | | |
|---|---|---|
| 0162957 | 12/1984 | European Pat. Off. . |
| 0270122 | 6/1988 | European Pat. Off. . |
| 0352187 | 1/1990 | European Pat. Off. . |
| 0422702 | 4/1991 | European Pat. Off. . |

(List continued on next page.)

OTHER PUBLICATIONS

Garshelis, "A Study of the Inverse Wiedmann Effect on Circular Remanence," IEEE Trans. on Magn., MAG–10 No. 2 344–358 (1974).

(List continued on next page.)

*Primary Examiner*—Richard Chilcot
*Assistant Examiner*—Elizabeth L. Dougherty
*Attorney, Agent, or Firm*—Sixbey, Friedman, Leedom & Ferguson, PC; Stuart J. Friedman

[57] ABSTRACT

A power sensor for providing an output signal indicative of the power transmitted by a rotating torqued member comprises a magnetoelastically active element for producing a magnetic field varying with the applied torque and a field modulating means for modulating the magnetic field in a periodic manner which is indicative of the speed of member rotation. A magnetic field vector sensor in the form of a coil senses the amplitude of the time rate of change of the modulated field for providing an output signal which is linearly indicative of the power transmitted by the rotating member. The field modulating means preferably comprises at least one ring having some uniformly spaced salient feature, such as gear-like teeth, around the periphery thereof. In one embodiment, the magnetoelastically active element comprises a ring of material endowed with an effective uniaxial magnetic anisotropy such that the circumferential direction is the easy axis, and magnetically polarized in a substantially circumferential direction. The ring is attached to the torqued member, such as a rotating shaft, so that application of a torque to the shaft is transmitted to the ring. In another embodiment, the magnetoelastically active portion includes two or more axially distinct, magnetically contiguous, oppositely polarized circumferential regions.

38 Claims, 14 Drawing Sheets

FOREIGN PATENT DOCUMENTS

| | | |
|---|---|---|
| 1115051 | 10/1961 | Germany . |
| 59-009528 | 1/1984 | Japan . |
| 1318933 | 12/1989 | Japan . |
| 2167565 | 5/1986 | United Kingdom . |
| 9001781 | 2/1990 | WIPO . |

OTHER PUBLICATIONS

Garshelis, "The Wiedmann Effects and Applications," IEEE Applied Magnetics Conference, 75 CH0964–7 MAG, 38 pages (1975).

Garshelis, "Conditions for Stress Induced Bulk Moments," J. Appl. Phys. 50(3), 1680–1682 (1979).

Garshelis, "A Versatile Magnetostrictive Displacement Transducer," IEEE Industrial Electronics Control Instrumentation Conference, 76 CH1 117–1 IECI, 99–105 (1976).

Y. Nonomura, E. A., "Measurements of Engine Torque with the Inter–Bearing Torque Sensor," SAE Technical Paper 1988, pp. 2.329–2.339.

G. Reiniger, "Halbleitersensoren Fur Massenmarkte," Elektrontechnik, Jan., 1985, Wurzburg DE, pp. 199–202.

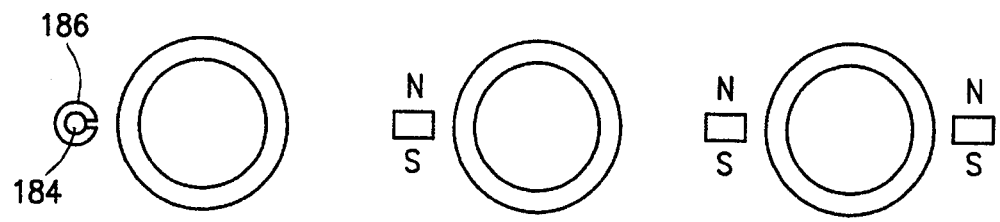
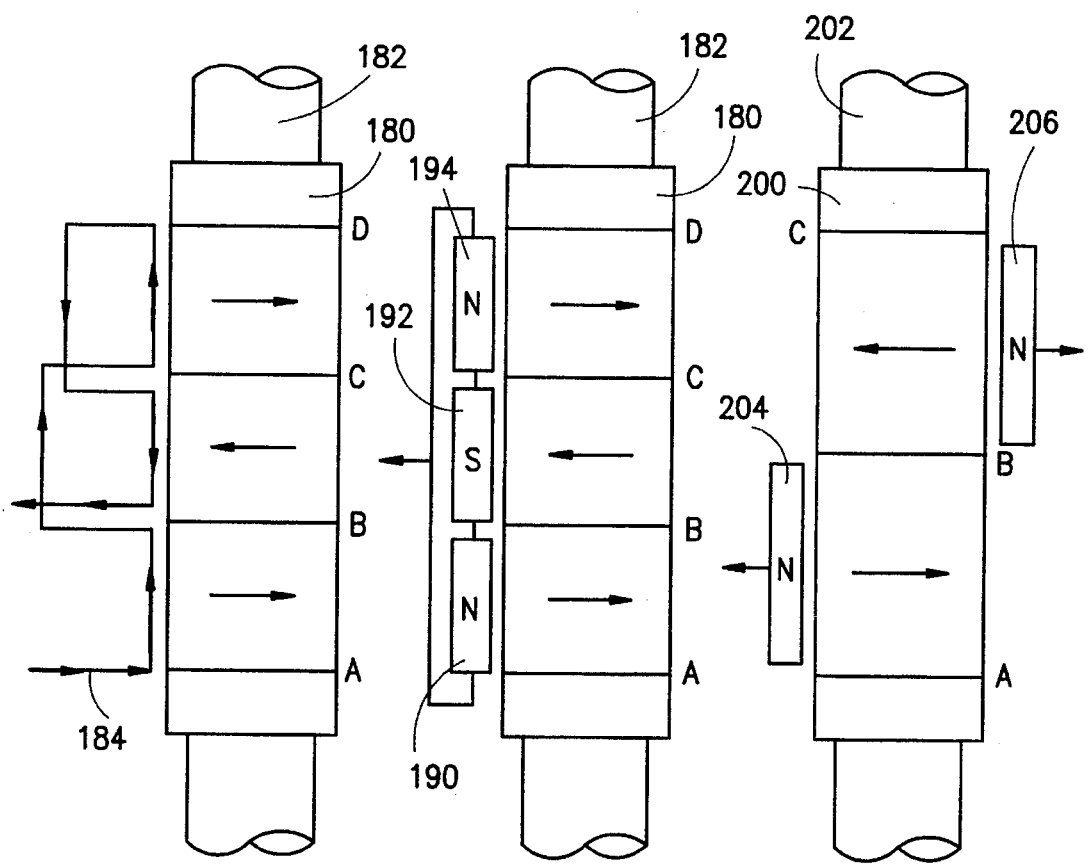

CIRCULARLY MAGNETIZED NON-CONTACT POWER SENSOR AND METHOD FOR MEASURING TORQUE AND POWER USING SAME

CROSS-REFERENCE TO RELATED APPLICATIONS

This application is a continuation-in-part of U.S. application Ser. No. 08/253,022, filed Jun. 2, 1994, now U.S. Pat. No. 5,520,059 which, is a continuation-in-part of U.S. application Ser. No. 07/736,299, filed Jul. 29, 1991, now U.S. Pat. No. 5,351,555.

FIELD OF THE INVENTION

The present invention relates to torque and power sensors and, more particularly, to non-contacting magnetoelastic torque and power transducers for providing a measure of the torque and power applied to a rotating shaft.

BACKGROUND OF THE INVENTION

Basic to the operation of modern machinery is the transmission of mechanical energy from source locations to points of utilization by means of rotating shafts. In a typical machine the energy is first imparted to a rotating shaft after conversion from chemical, thermal, electrical or kinetic sources within some prime mover such as an engine, turbine or motor. Machines often contain systems of shafts whose rotational motions are interconnected by couplings, belts, gears, or related devices in order to better match the prime mover to the load or to distribute the energy to a multiplicity of loads. Clutches between shafts allow for purposeful decoupling of their rotational motions. The mechanical energy imparted to the output shaft of the prime mover eventually is used to perform useful work in forms and at locations that characterize the function of the specific machine, e.g., propulsion of a vehicle, compression of a fluid, forming or machining of a manufactured part, electrical generation, etc. The ubiquity of utilization of rotating shafts to transmit and distribute mechanical energy is readily illustrated even with the very abbreviated listing in TABLE 1.

TABLE 1

Machines transmitting power with rotating shafts.

| INDUSTRY | TYPICAL MACHINE |
| --- | --- |
| Agriculture | Tractor, Combine, Harvester |
| Construction | Concrete mixer, Crane, Excavator |
| Food | Mixing, Bottling, Canning |
| Lumber/Paper | Sawing, Planing, Pulping |
| Mining/Oil | Boring, Loading, Pumping |
| Manufacturing | Machine tools, Conveying |
| Metals, Plastics | Rolling, Slitting, Extruding |
| Recreation | Ski lift, Amusement park rides |
| Textile | Weaving, Knitting, Sewing |
| Transportation | Land, Sea, Air vehicles |

The rate at which work is performed is termed Power. Power is also defined as "the time rate of transferring or transforming energy". When the mechanical energy performing the work is transmitted by a rotating shaft, power describes the rate of energy flow along the shaft. Transmitted power is thus clearly a measure of the functionality of a rotating shaft. From this perspective it is clear why "output power" is the primary quantitative factor used to rate both mechanical and electrical prime movers. It is also understandable why so many shaft driven machines, such as pumps and compressors, spindles on lathes, mills and grinders and other machine tools, and even some appliances such as vacuum cleaners and garbage disposal units, are often sized and compared by their power capacities. On-line measurement of the power actually being transmitted along key shafts in a machine can, by quantifying the machine's performance, enable its more precise control and adjustment and also help to ensure its safe and efficient operation. Noted departures from normally generated or utilized power can even provide an early indication of a developing fault.

The importance of on-line power measurement on rotating shafts in working machinery has long been recognized with the resulting development of more or less standardized measurement methods and apparatus. Since the power transmitted through a cross section of any shaft is the product of its instantaneous angular velocity and the torque transferred across the section, the measurement of this power generally reduces to the separate measurement of these two, more basic, quantities. Whatever technologies and specific types of rotational speed and torque measuring devices are actually employed, the determination of power still requires the multiplication of these separately measured quantities. Conventional power measuring instruments therefore include in the overall apparatus, besides means for measuring both speed and torque, some computational circuitry for on-line multiplication of these two, separate signals.

Speed Measurements

A great variety of methods and apparatus exist for measuring angular velocity of rotating shafts. Many of these are classical, having been in use for more than half a century. Speed measuring devices may be classified into two general types: those based on counting and timing discrete rotational events and those which develop a measurable physical quantity, e.g., a force or a voltage, proportional to velocity. Modern devices employing the counting and timing principles typically use non-contacting magnetic or optical means to sense the passage of salient features on an "encoder" wheel that rotates with the shaft of interest. Magnetic encoders are now routinely incorporated directly into the ball bearings used to support the shaft. Determining rotational speed with such devices requires either some form of clock (nowadays generally incorporated into the digital computer concerned with the processing and utilization of the speed information) or some electronic "frequency to voltage" conversion circuitry (e.g., a diode pump). A variety of technologies are utilized to directly develop analog indications of rotational speed. Most common among these are "drag cup" devices based on the forces associated with velocity dependent eddy currents. Use of this type of device requires the further conversion of the developed force into a proportional electrical signal. Small, permanent magnet, electric "tachometer" generators are often used to develop dc (or ac) voltages in direct proportion to rotational speed. Devices of this type are usually arranged to be driven by (or in synchronism with) the rotating shaft of interest rather than being mounted directly thereon. A different type of non-contacting tachometric device, as disclosed in U.S. Pat. No. 5,367,257, utilizes only a stationary combination of a permanent magnet and magnetic field sensor(s) to develop a signal proportional to the velocity of a conductive target, e.g., an aluminum disc mounted on the shaft of interest. There are clearly a variety of technologies and a wide choice of devices suitable for developing the rotational speed signals needed for on-line determination of the power being transmitted by a rotating shaft.

Torque Measurements

The net (i.e., resultant) torque from all rotating shafts entering or leaving a machine having an identifiable non-rotating frame can be simply determined by measuring the reaction forces which prevent the frame from rotating. The torque on the output shaft of engines, motors, etc. is often measured in this manner, either by measuring the forces directly at the mounts (U.S. Pat. No. 3,978,718) or on a torque balancing arm of a cradled, absorption type of dynamometer within which the transmitted energy is convened to heat (either directly or via its first conversion to electricity). Sometimes torque is inferred from measurements of acceleration (U.S. Pat. No. 3,729,989) or, with specific applicability to reciprocating engines, from dynamic measurements of cylinder pressure (U.S. Pat. No. 4,064, 748). It should be clear that such methods, by their very nature, are limited in applicability.

Measurement of the torque actually being transmitted on a rotating shaft generally relies on either the elastic or magnetoelastic properties of the shaft itself or of locally attached ad hoc materials. Whatever the underlying principle at work in a particular torque measuring device, the on-line determination of power is facilitated if the measured value of torque is presented in the form of an electrical signal. Measuring devices of this type are classified as torque transducers.

Torque transducers relying on shaft elasticity actually measure torsional strain, either in terms of the angular deflection over a dedicated section of the shaft having a length typically 10 or more times its diameter, or of the unit surface strain at a gauging "point", typically only a fraction of the diameter in length. Angular deflections of rotating shafts are often measured by utilizing magnetic (U.S. Pat. No. 3,273,386) or optical methods to sense the time difference between the passage of two, initially (circumferentially) aligned, axially separated features on the shaft (e.g., gear teeth, notches, reflective marks). Many of the recently developed torque transducers (especially those aimed at power steering applications) utilize the variable permeance associated with the twist dependent tooth/notch alignment of a pair of gear-like ferromagnetic discs effectively attached near opposite ends of a high compliance "torsion bar" (U.S. Pat. No. 4,876,899). Work on differential capacitive methods for sensing the angular twist in rotating shafts for automotive applications has also been reported. Operation of most commercially available torque transducers depends on sensing the surface shear strain by the change in electrical resistance of "strain gauges" adhesively bonded to the rotating shaft. Various methods are employed to bring electrical power to the gauges and to extract the electrical signal representing the torque. The reliability benefits of replacing the conventional method, using brushes and slip-rings, with non-contacting methods has encouraged the development of several alternative designs, e.g., using rotary transformers, infra-red light energy, or radio frequency telemetry. By their nature, elastic types of torque transducers require either a long gauging length, high compliance, or a considerable number of shaft mounted electrical components. These requirements discourage their application wherever size, reliability in rugged environments and/or cost are important considerations.

Magnetoelastic torque transducers rely on the fundamental interaction, found in most ferromagnetic materials, between certain measurable physical quantities generally classified separately as either an elastic or a magnetic property. The conventional constructions of these types of transducers depend on torque induced variations in the permeability of a dedicated portion either of the shaft surface itself or of a localized area of attached material (chosen specifically for its superior magnetoelastic properties). These constructions have been described, analyzed and compared in detail by Fleming, ("Magnetostrictive Torque Sensors—Comparison of Branch, Cross and Solenoidal Designs," SAE Paper No. 900264, 1990). Magnetoelastic torque transducers sense torsional stress rather than strain and therefore are generally torsionally stiffer than similarly rated elastic types. This leads to smaller envelope dimensions and mechanical robustness. Moreover, since these devices operate by an inherently non-contacting, magnetic mode of sensing, as a class they appear better suited for the measurement of torque on rotating shafts. However, the performance of these conventional types of magnetoelastic torque transducers is highly dependent on magnetic excitation parameters and material variations, factors which complicate temperature compensation and calibration stability. See, for example, U.S. Pat. Nos. 4,920,809 and 5,307,690. This makes it difficult to design low cost, mass producible units.

A different type of magnetoelastic torque transducer technology is disclosed in U.S. Pat. No. 5,351,555, different in that a circumferentially polarized ring of magnetoelastically active material actually creates a magnetic field that, in polarity and intensity, is a near perfect linear analog of the torque carried by a shaft on which the ring is mounted. These transducers use no excitation power and require only a magnetic field sensor in addition to the ring to construct a complete device. Second generation transducers, using two oppositely magnetized rings or a single ring having contiguous regions of opposite circular polarizations together with symmetrically located field sensors, also offer effective immunity to ambiguous effects of ambient magnetic fields. See, Garshelis et al., "A Torque Transducer Utilizing Two Oppositely Polarized Rings," IEEE Trans. Magn., Vol. 30, No. 6, 1994; pp. 4629–31. Still, in many applications, realization of the full benefits from this basically simple, low cost and readily adaptable construction is hindered by a limitation of economically compatible field sensors. Thus while integrated circuit silicon Hall effect sensors are available in small, standardized packages, are electrically simple and low in cost, even the best commercially available devices have output drifts with temperature that are commensurate in magnitude with the torque respondent output signals. Compensation techniques to overcome this problem, e.g., using matched pairs, can add sufficient cost to mitigate the economic attractiveness of this technology. The non-availability of "off the shaft" components for other field sensing technologies, e.g., "flux gate" methods, necessitates a specific field sensor design for each newly contemplated torque transducer.

Power Measurements

Most shaft power measuring instruments use clearly distinct devices for developing the speed and torque signals. See, for example U.S. Pat. Nos. 3,978,718, 4,064,748, 4,100,794, 4,106,334, 4,306,462, 4,406,168, 4,479,390. Sometimes speed and torque are determined from the measurement of two related time intervals (see, U.S. Pat. Nos. 3,729,989, 3,273,386, 5,192,382) and some devices, while employing different sensing technologies for the two measurements, combine both sensors within the same housing (see, U.S. Pat. No. 5,323,659). Nevertheless, with all such devices, multiplication of the two measured values is required to determine the power transmitted by the rotating shaft. One notable exception is the measuring device of U.S. Pat. No. 2,365,073 which recognizes the desirability of providing both torque and speed information in one signal. However, in that early device speed was determined from the fortuitous presence of a fixed pattern of torque variation. Accordingly, such a device would only have very limited applicability.

SUMMARY OF THE INVENTION

Therefore, it is an object of the present invention to provide a non-contact magnetoelastic torque transducer for use with rotating shafts which is useful with low cost, solid state field sensors yet is unaffected by the undesirable consequences of drift in the quiescent output signal which characterizes such field sensors.

It is another object of the present invention to provide a non-contact magnetoelastic torque transducer which provides a single output signal containing easily separable shaft torque and shaft speed information, enabling power to be determined from a single transducer.

It is still another object of the present invention to provide a non-contact magnetoelastic power transducer which provides an output signal proportional to the transmitted power.

It is a further object of the present invention to provide a non-contact magnetoelastic power transducer in which the output signal is generated by the rotation of the shaft.

It is a still further object of the present invention to provide a non-contact magnetoelastic transducer of the polarized ring type which provides an output signal proportional to torque when using a solid state magnetic field vector sensor and an output signal proportional to power when using a coil as the magnetic field vector sensor.

It is yet another object of the present invention to provide a non-contact magnetoelastic torque sensor which utilizes a magnetoelastically active ring and a magnetic field modulator to create a circumferentially modulated magnetic field which, at any angular position, in polarity and intensity, is a near perfect linear analog of the torque carried by a shaft on which the ring is mounted.

It is a further object of the present invention to provide a magnetoelastic torque/power transducer which depends for its operation on the sensing of a quantity that is inherently zero when the torque being measured is zero and which changes in both direction and magnitude in a correlative manner with the torque being measured.

It is a still further object of this invention to provide a magnetoelastic torque/power transducer which requires no excitation field.

It is still another object of the invention to provide a magnetoelastic torque/power transducer comprising a magnetoelastically active portion which has been endowed with an effective uniaxial magnetic anisotropy having the circumferential direction as the easy axis, and magnetically polarized in a substantially circumferential direction.

Yet another object of the invention is to provide a magnetoelastic torque transducer comprising a magnetoelastically active portion which includes two or more axially distinct, magnetically contiguous, oppositely polarized circumferential regions.

Still another object of the invention is to provide a magnetoelastic torque/power transducer in which the need for shielding structures for avoiding detected magnetic field variation due to ambient fields is minimized or eliminated.

Another object of the invention is to provide a magnetoelastic torque/power transducer wherein the detected field is substantially insensitive to external magnetic field sources, such as ambient fields.

A further object of the present invention is to provide a non-contact method for measuring torque applied to or power transmitted by a rotating shaft comprising the steps of: attaching to a rotating torqued member a circumferential transducer endowed with an effective uniaxial magnetoelastic anisotropy and magnetically polarized in the circumferential direction, which produces a magnetic field varying in response to torque on the transducer, modulating the torque-created magnetic field in a periodic manner, which period is indicative of the speed of shaft rotation, and sensing a component of field output of the transducer as an indication of torque on or power transmitted by the rotating torqued member.

A still further object of the invention is to provide a method for making a magnetoelastically active torque/power transducer having two or more axially distinct, magnetically contiguous, oppositely polarized circumferential regions.

These objects and others are achieved by providing a torque/power sensor for rotating shafts comprising a magnetoelastically active element for creating a magnetic field indicative of the torque applied to the shaft, field modulating means for modulating the magnetic field in a periodic manner indicative of the speed of shaft rotation, and a magnetic sensor, such as a Hall effect sensor or coil, responsive to the field of the magnetoelastically active portion. In the preferred embodiment, the magnetoelastically active portion comprises a ring of material endowed with an effective uniaxial magnetic anisotropy such that the circumferential direction is the easy axis, and magnetically polarized in a substantially circumferential direction. The ring is attached to the torqued member, such as a rotating shaft, so that application of a torque to the shaft is transmitted to the ring. In like manner the field modulating means is attached to the ring or to the shaft at a location which is magnetically contiguous to the ring. The torque on the ring reorients the circumferential magnetic orientation of the ring, producing a helical magnetic orientation having both circumferential and axial components. A magnetic field vector sensor is mounted in a fixed position relative to the ring and oriented so that it responds to the modulated field arising from the axial component of the magnetization within the ring. The magnetic field vector sensor may be mounted on a flux collector if desired. The output of the sensor is thus proportional to the change in orientation of magnetization in the ring resulting from torque applied to the shaft and transmitted to the ring and, where the sensor is a coil, to the speed of rotation of the shaft.

In another embodiment of the invention these and other objects are achieved by providing a torque sensor wherein the magnetoelastically active portion includes two or more axially distinct, magnetically contiguous, oppositely polarized circumferential regions. Each region may comprise a physically separate ring or multiple regions may be formed on a single ring.

BRIEF DESCRIPTION OF THE DRAWINGS

FIG. 14 illustrates one method and apparatus for the simultaneous polarizing of multiple regions on a transducer ring;

FIG. 15 illustrates another method and apparatus for the simultaneous polarizing of multiple regions on a transducer ring;

FIG. 16 illustrates still another method and apparatus for the simultaneous polarizing of multiple regions on a transducer ring.

DETAILED DESCRIPTION OF THE PREFERRED EMBODIMENTS

Figure 1:
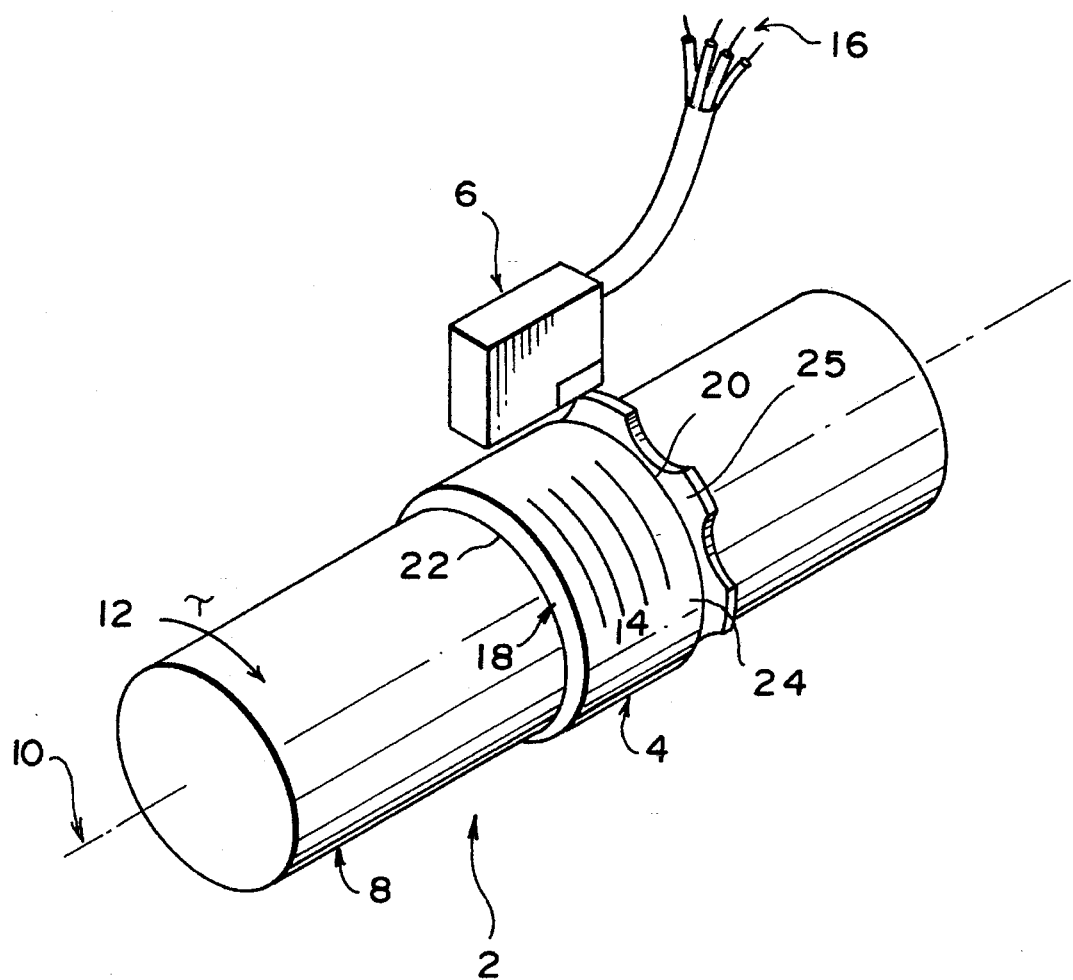
FIG. 1 is an assembly drawing showing the sensor of the present invention.

Referring first to FIG. 1, a first embodiment of a torque/power sensor according to the present invention is shown generally at 2. Torque/power sensor 2 comprises transducer 4 and magnetic field vector sensor 6. Torque sensor 2 is mounted on a shaft 8 which is part of a machine (not shown) and rotates about a central longitudinal axis 10. Torque 12 is applied at one portion of shaft 8 and is transmitted thereby to another portion of the shaft where the motion of shaft 8 due to torque 12 performs some useful work. Torque 12 is shown as being in a clockwise direction looking at the visible end of shaft 8, but obviously can be applied to rotate the shaft in either or both directions depending on the nature of the machine incorporating shaft 8.

Transducer 4 is firmly attached to shaft 8 in one of a number of ways to be explained in detail later, and acts as a means for providing an axially or radially identifiable, magnetoelastically active region on the shaft 8. In practice, transducer 4 will preferably take the form of a cylindrical sleeve or ring with end faces 18 and 20, inner surface 22, and outer surface 24, suitably attached to shaft 8 at a convenient location along axis 10 which is within the torsionally stressed region of shaft 8. Transducer 4 is endowed, by prior processing or as a collateral effect to the means of attachment to shaft 8, with an effective uniaxial magnetic anisotropy having the circumferential direction as the easy axis. In addition, transducer 4 will also be magnetically polarized in one or the other circumferential direction by any effective method, several of which will be later described. Briefly, transducer 4 is magnetically polarized in a substantially purely circumferential direction 14, at least to the extent that, in the absence of torque 12 (in a quiescent state), it has no net magnetization component in the direction of axis 10 and has no net radial magnetization components. Thus, domains whose magnetizations originally had components in the opposite circular sense are substantially eliminated. If the circular anisotropy is suitably dominant, all of the domain magnetizations will lie within at most a plus or minus 45° limit, and will be symmetrically distributed within small enough volumes of the ring to ensure that no uncompensated external flux is sensible by magnetic field vector sensor 6. The closed cylindrical shape of transducer 4 enhances the stability of the polarization of transducer 4 by providing a complete circuit.

As will be seen, due to the construction and processing of transducer 4, application of torsional stress to shaft 8 and thus to transducer 4 causes reorientation of the polarized magnetization in the transducer 4. The polarized magnetization becomes increasingly helical as torsional stress increases. The helicity of the magnetization in transducer 4 depends on the magnitude of the transmitted torque 12, and the chirality is dependent on the directionality of the transmitted torque and the magnetoelastic characteristics of transducer 4. The helical magnetization resulting from torsion of transducer 4 has both a circumferential component in direction 14 and an axial component along axis 10. Of particular importance is that the magnitude of the axial component depends entirely on the torsion in transducer 4.

Because of symmetry in the case of domains of transducer 4 which are not precisely circumferentially polarized, and because of the pure circularity of other magnetic orientation in other domains, there is no sensible field in the space external to the quiescent, untorqued transducer 4. Indeed, there is no passive external means of discerning that the transducer 4 is in fact polarized. The action of the biaxial principal stresses associated with the transmission of torque, via the intrinsic magnetoelastic interaction of the material of transducer 4, adds an additional anisotropic influence to the equilibrium orientation of each domain's magnetization, altering the effective easy axis direction of every domain towards the nearest effective principal stress (the stress being tensile in materials with positive magnetostrictions, and compressive in materials with negative magnetostrictions). The original symmetry or pure circularity of the magnetization is thus broken by the application of torque so that a net helicity appears in the magnetization within transducer 4. This helicity, combined with the single circular sense of the polarization, results in a magnetization that may be resolved into two components: a circumferential component and an axial component. While the circumferential component is, as has already been mentioned, not a source of detectable fields in the space external to the transducer 4, the axial component can be readily detectable. Transducer 4, when torqued, generates a field externally indistinguishable from that of a tubular bar magnet, with the bar magnet's axial magnetization equal to the volumetrically averaged axial component of the helically directed magnetization of each domain. Thus, the direction of applied torque determines (together with the sign of the effective magnetostriction of the transducer 4 material) the polarity of the equivalent bar magnet, and the magnitude of the torque determines the strength of the equivalent bar magnet.

Figure 2:
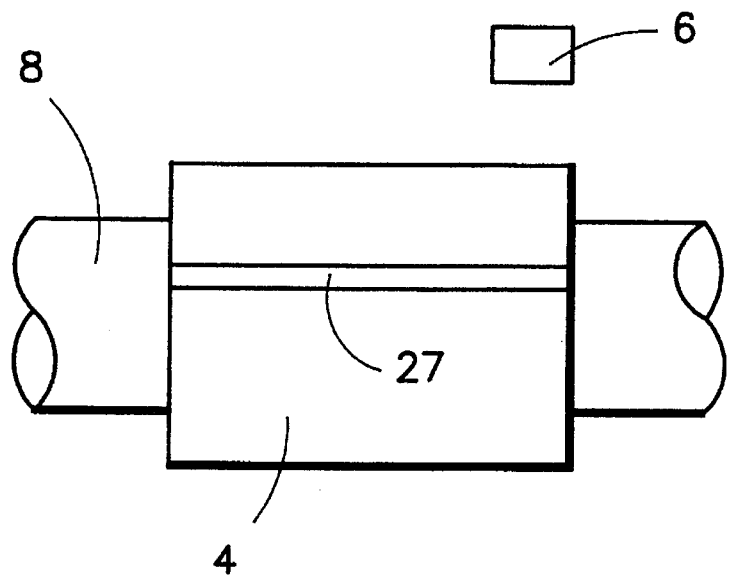
FIG. 2 is a diagram showing the use of a magnetically permeable strip as a field modulator in the present invention.

A field modulator, here shown as toothed homogenizer ring 25 of Permalloy or similarly magnetically soft material, is provided proximate one or both polar regions 18, 20 of the transducer 4 (shown here as proximate end face 20) and firmly attached to shaft 8 or, preferably, to transducer 4 in one of a number of ways to be explained in detail hereinafter with respect to attachment of transducer 4 to shaft 8 and having in mind that field modulator 25 is not a torque carrying member. It is important that field modulator 25 be fixed in angular position and that it be attached to shaft 8 or transducer ring 4 in such a manner that it rotates as a unit with shaft 8. It is preferable to locate field modulator 25 at the polar regions 18, 20 because that is where the flux is strongest. However, if signal strength is not a primary consideration, field modulators 25 could be located anywhere between the polar ends 18, 20. The periphery of toothed ring 25 is provided with some uniformly spaced salient feature, such as the gear-like teeth illustrated in FIGS. 1 and 3. These teeth modulate the permeance of the flux paths through magnetic field vector sensor 6 as the shaft rotates with the result that the field intensity in space near transducer 4 will vary in intensity with a circumferential pattern representative of the peripheral features. It will be appreciated that inasmuch as the function of the field modulator is to modulate the permeance of the flux paths through sensor 6, this function can be accomplished using means other than a toothed homogenizer ring 25. Thus, the field modulator may be any means for disturbing the otherwise circular uniformity of the torque created magnetic field about transducer 4 in a periodic manner which is tied to the angular position of the shaft and is, therefore, indicative of the speed of shaft rotation. For example, as shown in FIG. 2, the field modulator may be a Permalloy strip or strip of similarly soft magnetic material 27 affixed to and axially oriented on the surface of transducer 4 after transducer 4 has been magnetically polarized. As a further example, the field modulator may be a circumferential ring or disk having Permalloy dots uniformly spaced around its peripheral margin on the face thereof adjacent to the immediate end face 18, 20 of the transducer 4.

Figure 3A:
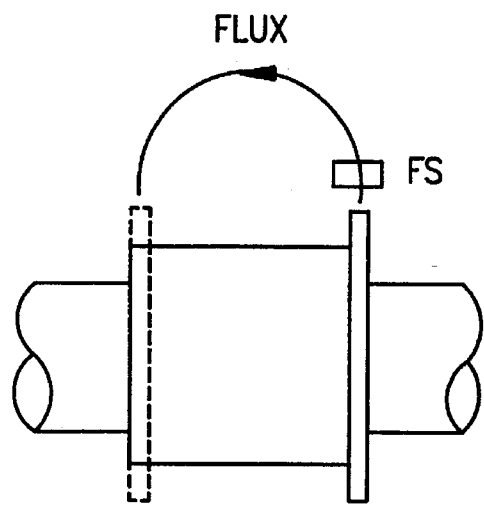
FIGS. 3(a) and 3(b) are views of the sensor of the present invention with and without a toothed wheel field modulating ring.
Figure 3B:
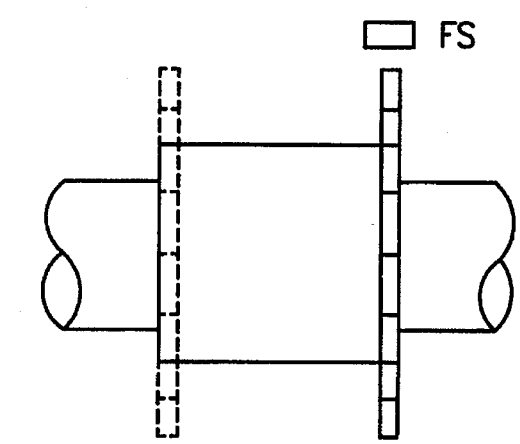
Figure 3C:
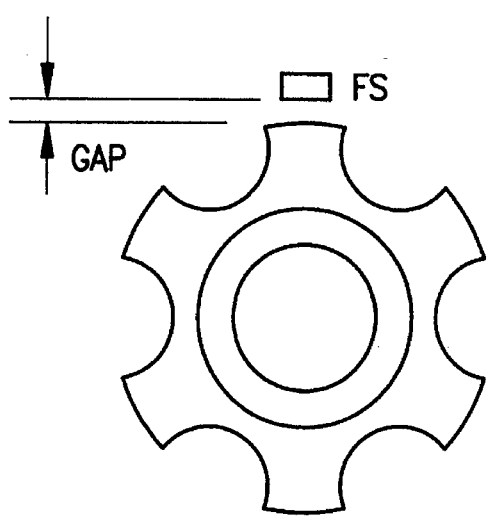
FIGS. 3(c) and 3(d) are plan views of a toothed wheel field modulating ring indicating the effective air gaps between it and a magnetic field vector sensor.
Figure 3D:
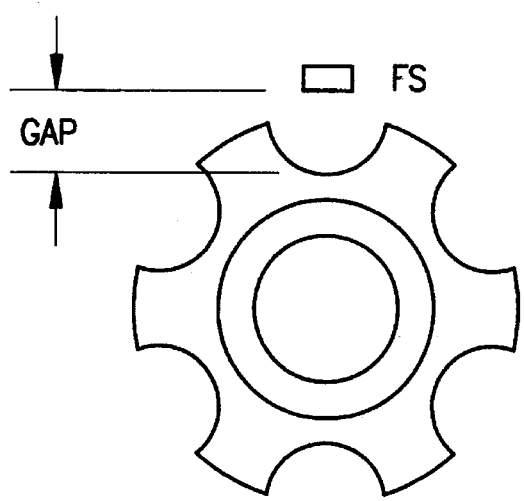
Figure 4A:
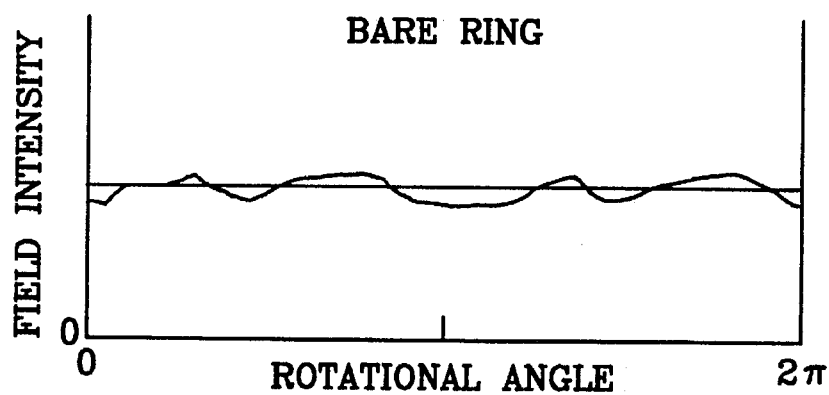
FIGS. 4(a) through 4(c) are graphs showing the effect of homogenizer and modulating rings on the field intensity sensed with the sensor of the present invention.
Figure 4B:
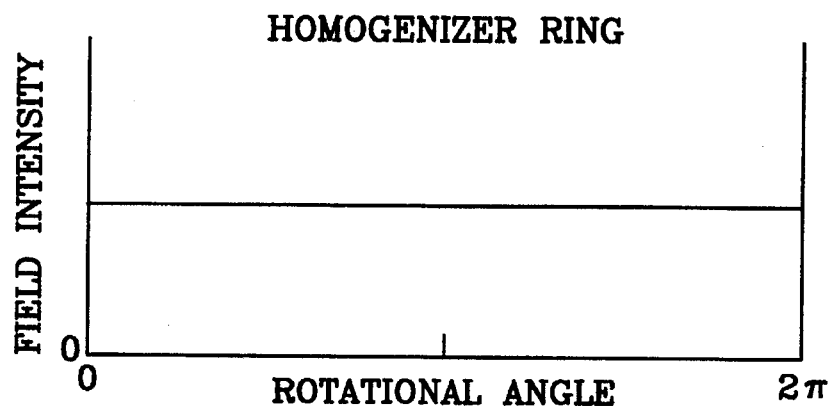
Figure 4C:
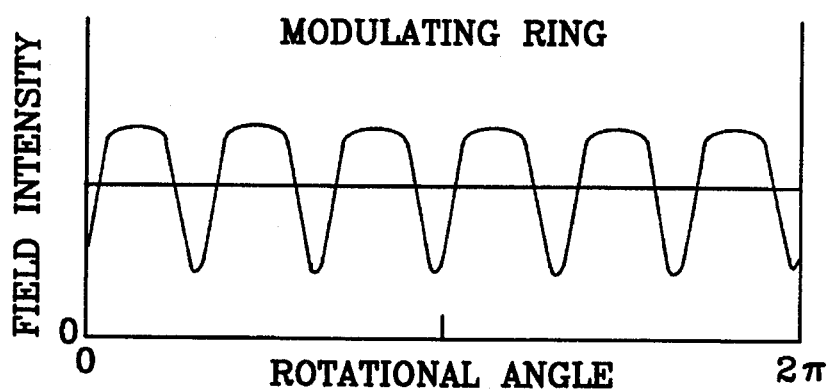

The effect of a field modulator such as toothed homogenizer ring 25, shown in FIGS. 3(c) and 3(d), on the circumferential variation of field intensity at a fixed radius on a polar region of magnetoelastic transducer ring 4 with a fixed torque applied is compared with the variation in field intensity for transducer rings having no homogenizer rings (FIG. 4a) and having smooth (non-toothed) homogenizer rings (FIG. 3a; FIG. 4c). It can be seen by comparing FIGS. 4a and 4c that when a homogenizer ring is present the circumferential uniformity of the field is assured. The effect of a toothed periphery modulating ring 25, where the air gap between the field sensor and the modulating ring varies between the extremes shown in FIGS. 3(c) and 3(d), is shown in FIG. 4(c). It will be appreciated that the actual field intensity at any particular point along the circumference of any one circle will vary linearly with the torque. The polarity of the field, being dependent only on the CW or CCW directionality of the torque, will therefore be constant around any such circle.

Magnetic field vector sensor 6 is a magnetic field vector sensing device located and oriented relative to transducer 4 so as to sense the magnitude and polarity of the field arising in the space about transducer 4 as a result of the reorientation of the polarized magnetization from the quiescent circumferential direction to a more or less steep helical direction and the modulation due to field modulator 25. As will be seen, magnetic field vector sensor 6 provides a signal output reflecting either the magnitude of the torque applied to the rotating shaft or the power transmitted by the rotating shaft. In one embodiment, magnetic field vector sensor 6 is an integrated circuit device, such as a Hall effect sensor, and its output is indicative of the torque applied to the shaft. In this embodiment, wires 16 connect the magnetic field vector sensor 6 to a source of direct current power, and transmit the signal output of IC magnetic field vector sensor 6 to a receiving device (not shown), such as a control or monitoring circuit for the machine or system incorporating shaft 8. In another embodiment, magnetic field vector sensor 6 is a coil, preferably a coil of conductive wire wound on a soft magnetic core, the output of which is indicative of power transmitted by the shaft.

Figure 5:
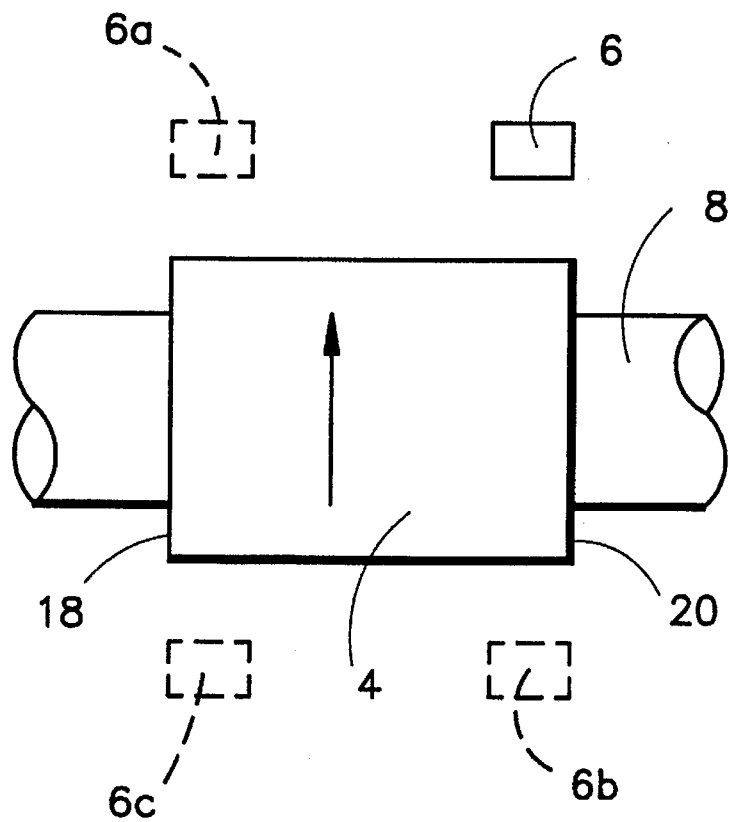
FIG. 5 is a schematic diagram of a transducer ring mounted on a shaft showing alternative locations for magnetic field vector sensors.

As shown in FIG. 5, magnetic field vector sensor 6 is preferably located near the polar edge 18 (or edge 20) of transducer 4, since, when transducer 4 is polarized in a single direction, the orientation of the magnetic field from transducer 4 dictates that greater field intensity will be present near the edges 18 and 20 of transducer 4 than in other regions proximate to transducer 4. Of course, where signal strength is not a primary consideration, sensor 6 may also be located between the polar edges 18, 20. In another embodiment of the present invention, also shown in FIG. 5, two magnetic sensors 6 and 6a (the latter shown in phantom) are used. The magnetic sensors 6 and 6a are disposed at opposite ends of transducer 4, near edges 18 and 20 respectively. Multiple sensor embodiments increase the cost of the device, but are desirable because the magnetic sensors 6 can be connected differentially for common mode rejection of temperature variations, voltage variations, and ambient field signals. Optionally, to minimize ambient field effects, magnetic sensors 6 may be shielded by a shield (not shown), made of any material having very low magnetic permeability. Such a shield may surround magnetic sensors 6 in all directions other than the direction of flux received from transducer 4. Of course, a larger number of magnetic sensors could also be used if desired. For example, in another embodiment shown in FIG. 5, four magnetic sensors 6, 6a, 6b and 6c are used (6a, 6b and 6c are shown in phantom), with two disposed diametrically opposite to the other two with respect to transducer 4.

In the preferred embodiment, a yoke (not shown) of magnetically soft (low coercive force, high permeability) material is provided in conjunction with the magnetic field sensor or sensors 6. The yoke serves as a means for increasing the permeance of the flux closure path through the magnetic field vector sensor 6. A yoke is particularly useful with Hall effect integrated circuits, since these devices tend to have relatively high noise levels, increasing with decreasing frequency. Thus, it is preferable to operate these devices using higher rather than lower field strengths to increase the S/N (signal/noise) ratio. Various type yokes and yoke/sensor arrangements are disclosed in U.S. Pat. No. 5,351,555, the disclosure of which is incorporated by reference herein.

Magnetic Sensor Construction

For use of sensor 2 as a torque sensor, magnetic field vector sensor 6 preferably comprises one or more solid state sensing devices, such as Hall effect, magnetoresistance, magnetotransistor ("magnistor"), magnetodiode, or MAG-FET (Magnetic Field Effect Transistor) sensors. Other possible sensors include non-linear cores, having magnetic properties varying with H, magnetometers and flux gate magnetometers.

The solid state sensors are preferred in this application because of their small size and low cost, and because they can incorporate in an integrated package desirable electronics for temperature compensation, signal conditioning, voltage regulation, and other operational functions. Hall effect sensors are particularly preferred because they have an ideal transfer characteristic which is both linear and polarity-sensitive. Some integrated circuit Hall Effect sensors suitable for use as magnetic field vector sensor 6 are Model No. AD22150 made by Analog Devices, Models UGN3503U and UGN3506UA made by Allegro MicroSystems, Inc. Similar, potentially suitable devices are also manufactured by MicroSwitch, Siemens, and Wolff Controls Corporation.

Magnetic field vector sensor 6 is located and oriented to produce a maximum response to the external field arising with the transmission of torque. Following from the equivalence of the torqued transducer 4 and an axially magnetized bar magnet, the most intense fields will be found near the poles, i.e., near end faces 18 and 20 of transducer 4. Magnetic field vector sensor 6 is preferably fixed proximate to shaft 8 and does not rotate. Since most major applications of torque transducer involve rotating torqued members such as shaft 8, magnetic field vector sensor 6 must be radially separated from shaft 8 to avoid physical contact with shaft 8 as shaft 8 rotates. While the precise location and orientation of the magnetic field vector sensor 6 will depend on its particular operating principle, package size, active area and other details of construction as well as geometric and magnetic characteristics of transducer 4 (e.g., sharpness of corners, radial thickness, axial length, diameter, number of oppositely polarized, magnetically contiguous circumferential regions) and the required radial space, an approximately optimum location for magnetic field vector sensor 6, for use with a transducer 4 which is polarized in a single direction, will usually be found radially outward from one of the end faces 18 and 20, oriented to sense radial flux.

The magnetic field vector also varies in direction in the space around transducer 4. Recognizing that sensors 6, e.g., Hall effect devices, have a unique sensing axis, it becomes possible to orient the sensing device in an advantageous manner relative to the shaft axis. When the sensor 6 is advantageously oriented, the fall off in field intensity (H) with increasing distance from the transducer 4 is compensated by an increasing sensitivity of the field sensor 6 to the field vector as the direction of the field vector becomes more closely aligned with the orientation of the sensing axis. Stated otherwise, if $\Theta$ is the angle between the unique sensing axis of sensor 6 and the field vector, and the output of sensor 6 is proportional to $H\cos\Theta$, although H may diminish with distance from the transducer ends, as long as $\Theta$ also diminishes (i.e., the sensing axis and field vector directions are made to coincide), $\cos\Theta$ increases to offset the decrease in H. Thus the need for precise radial gap control between the transducer 4 and sensor 6 is alleviated.

Historically, despite their many benefits, the disadvantage of integrated circuit silicon Hall effect sensors is that they exhibit significant output drift with temperature of a magnitude which is often commensurate with the torque respondent output signals. It is one of the advantages of the present invention that by modulating the otherwise circular uniformity of the created magnetic field about transducer 4, in a periodic manner which is tied to the speed of shaft rotation, the undesirable consequences of drift in the quiescent output signal of such field sensors can be avoided. Thus, the present invention provides a low cost, non-contact, polarized ring magnetoelastic torque sensor whose full benefits can be realized because low cost, integrated circuit silicon Hall effect sensors can be used without concern for the output drifts which traditionally have characterized such sensors. The following analysis explains why the sensor of the present invention is free from such thermal or other drifts.

In the presence of torque T on the shaft, the field intensity $H_t$ at FS when FS is directly opposite a tooth, as in FIG. 3(c), may be found from $$H_t = k_t T \qquad (1)$$

where the value $k_t$ depends on the ring material and its dimensions as well as on the actual location of FS relative to the ring. Thus $k_t$ is a constant associated with the specific transducer construction. Similarly, when the shaft rotates into a position such that FS is centered over a space, as in FIG. 3(d), the field intensity $H_s$ becomes $$H_s = k_s T \qquad (2)$$

where $k_s$ is clearly smaller than $k_t$ and also reflects the specifics of the transducer construction. Between these two locations the field intensity will vary continuously following some function of the rotational angle determined by both the precise tooth/space shapes and the point in space at which it is measured. Nevertheless, at any rotational angle and for any air gap, the field intensity will follow the transfer function of the transducing ring, i.e., it will be a linear function of the torque. If the shaft rotates continuously, the field intensity at FS thus varies between the two extreme values, $H_t$ and $H_s$, each a linear function of the torque. The output signal $V_o$ from FS in any field H will in general be found from $$V_o = QV_o + SH \qquad (3)$$

where $QV_o$ is the quiescent output signal (i.e., the offset voltage in zero field) and S is its sensitivity factor. Thus, the output signal will vary between $$V_{ot} = QV_o + SH_t \qquad (4)$$

when FS is opposite a tooth, and $$V_{os}=QV_o+SH_s \tag{5}$$

when FS is opposite a space. As the shaft rotates the output signal will periodically vary between these two extreme values. The peak variation in output signal, $\Delta V_{op}$, is found from the difference between $V_{ot}$ and $V_{os}$ as $$\begin{aligned}\Delta V_{op} &= (QV_o + SH_t) - (QV_o + Sh_s) \tag{6}\\ &= S(H_t - H_s)\end{aligned}$$

which is both a linear function of the torque and independent of $QV_o$. $\Delta V_{op}$ is thus free from the thermal or other drifts in $QV_o$ peculiar to any one field sensing device.

Figure 6:
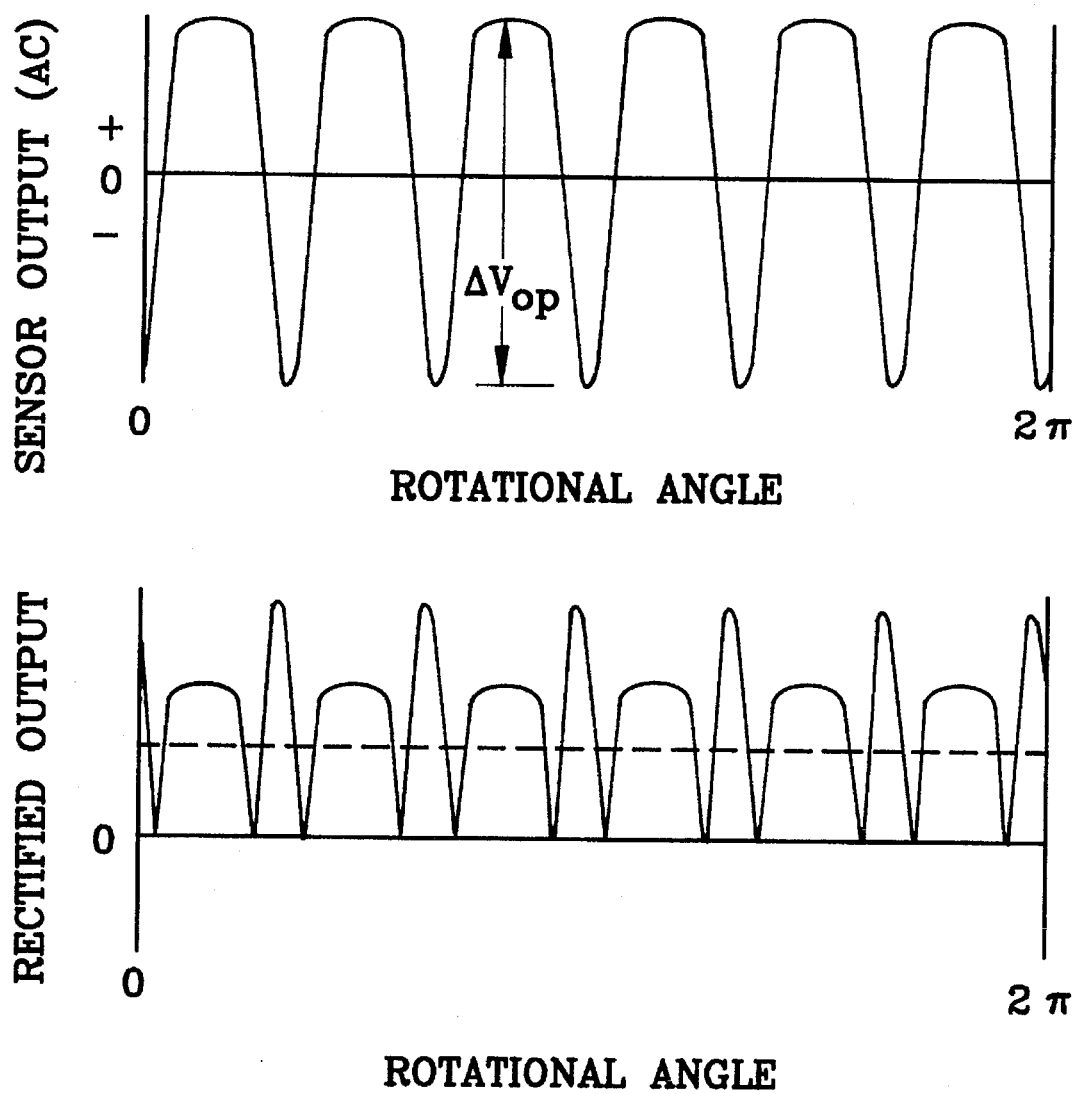
FIG. 6 are graphical representations of the periodic waveform for the variational (ac) component produced by the sensor of the present invention.

Recognizing that the shape of the periodic waveform resulting from the variation in $V_o$ accompanying shaft rotation is constant for any specific transducer construction, it should be clear that the measurement of any characteristic amplitude of the variational (ac) component of the $V_o$ waveform, e.g., peak to peak, rms, average of absolute value, etc. will provide a value that is linearly dependent on $\Delta V_{op}$ and hence will be a valid measure of the torque. This is illustrated in FIG. 6 wherein the upper plot shows the variational (ac) component of the signal from the field intensity sensor, having the raw output signal shown in FIG. 4(c), as a function of rotational angle. The peak to peak amplitude is a linear function of the torque. The lower plot shows the rectified waveform of the variational (ac) component shown above. The dotted line represents the average of absolute values over the full rotation which, for any fixed waveshape, varies directly with $\Delta V_{op}$.

It should also be clear that the frequency of this waveform is proportional to the rotational speed, being simply the number of teeth in the ring (a constant for any one transducer) multiplied by the speed. Thus by spatially modulating the sensed portion of the torque responsive field from a magnetically polarized ring, a single signal containing both torque and speed information can be obtained with neither signal component being affected by the drift characteristics of the field sensing device.

If the ac component of $V_o$ (i.e., Voac) vs time waveform is assumed for the moment to be represented by the simple sinusoidal function:

$$V_{oac}=kT \sin(n\omega t) \tag{7}$$

where n is the number of teeth on the field intensity modulating ring and $\omega$ is the angular velocity of the shaft, its time derivative becomes $$dV_{oac}/dt=knT\omega\cos(n\omega t). \tag{8}$$

Other than the constructional constants k and n, the amplitude of the periodic function defined by equation (8) is seen to be proportional to the product $T\omega$ and this product is the power being transmitted by the shaft. Since more complex waveforms can be represented by the sum of fundamental and harmonically related sinewaves, the sum of the derivatives of these components will similarly have an amplitude that is proportional to power.

It is not necessary to compute the time derivative of the output voltage from a field intensity sensor in order to develop a signal that is proportional to power. As the shaft rotates, the time varying magnetic field in the vicinity of the modulator ring will induce a periodic voltage, e, in a nearby coil, having N turns, that is at all time proportional to the instantaneous rate of change of flux linking the coil, i.e., $$e=Nd\psi/dt \text{ (Faraday's Law)}. \tag{9}$$

While changing periodically during rotation of the shaft, the flux change $d\phi$ during any small angular rotation of the shaft $d\Theta$ is always a linear function of the torque (since the flux density is proportional to the field intensity). Thus $$d\phi/d\Theta=cT \tag{10}$$

where c varies both with constructional details and the rotation angle. Since the angular velocity $\omega=d\Theta/dt$, the induced voltage can be expressed as $$e=N(d\phi/d\Theta)(d\Theta/dt)=(NT\omega)c. \tag{11}$$

Thus while the voltage induced in the coil changes periodically with rotation angle, it's amplitude is proportional to $T\omega$, i.e., the power transmitted along the shaft. Rotational speed may, if desired, be obtained from the frequency of this signal. It is to be noted that with this simple construction, no electrical power source is required to obtain a signal proportional to the power being transmitted by the shaft since this signal is actually generated by the rotation of the shaft.

Transducer Construction

The construction of an effective transducer 4 for use in the present invention requires proper dimensioning, proper material selection and proper application and orientation of magnetization. These and other aspects of transducer construction are disclosed in detail in U.S. Pat. No. 5,351,555, the disclosure of which is incorporated herein by reference.

The transducer 4 is preferably cylindrical or ring shaped having a relatively thin wall thickness. Materials therefor should be selected by matching properties of available materials with the performance requirements of the transducer application and in conjunction with selection of the materials for shaft 8. In the most preferred embodiment, the transducer 4 is constructed of nickel maraging steel, such as 18% nickel maraging steel. Other well known materials are also appropriate, depending upon the characteristics of the application. Whatever the material selected it must be ferromagnetic to assure the existence of magnetic domains and magnetostrictive in order that the orientation of the magnetization may be altered by the stresses associated with an applied torque.

Transducer 4 can be constructed in its basic shape from the selected material by any suitable material working process. Following formation of transducer 4, two steps are performed to impose the desired circumferential magnetic field orientation on the material of transducer 4. First, transducer 4 is endowed, by prior processing or as a collateral effect of its attachment to shaft 8, with an effective uniaxial magnetic anisotropy having the circumferential direction as the easy axis. Second, transducer 4 must be polarized in one or the other circumferential direction.

The first step in setting up the required magnetic field orientation is to impose circumferential quiescent magnetic anisotropy on the structure of transducer 4. Magnetic anisotropy is preferably produced by physical working of the material of transducer 4. Any physical source of magnetic anisotropy can be used, alone or in combination, to attain the desired distribution of quiescent domain orientations, being circumferential within plus or minus 45°. One source of magnetic anisotropy is magnetocrystalline i.e., "crystal anisotropy," which refers to the preferred orientation of the magnetic moments ("spins") of the atoms (ferromagnetic atoms) in directions correlated with the axes which define the crystal structure. A second source of magnetic anisotropy is directional order, which refers to the distribution of atomic species, lattice defects, inclusions (exclusions) or other chemical or structural features found in one direction (or more than one, but not all). A third source of magnetic anisotropy is magnetoelastic, which is associated with the directionality of stress in materials having a spontaneous magnetostrictive strain correlated with their spontaneous magnetic moment (magnetostriction-ferromagnetic). A fourth source of magnetic anisotropy is shape of the material, which is associated with the divergence of M at material boundaries. Specifically, a demagnetizing field arises from the "poles" of a magnetized body, and is more intense if the poles are closely spaced. Shapes other than spherical shapes inherently have some axes which are magnetically "easier" than others. Indeed, the preferred ring shape of transducer 4 has the circumferential direction as the easiest axis for magnetization.

Any or all of these physical sources of anisotropy can be used in constructing transducer 4. However, a preferred embodiment of the invention provides that the transducer 4 be assembled to the shaft with a "press fit," "shrink fit," or other type of "interference fit" wherein the inside diameter of the transducer 4 is made smaller than the outside diameter of the shaft at the interface. This construction places the transducer 4 into circumferential tension (referred to as "hoop stress"). If the transducer 4 is fabricated from a material having a positive magnetostriction, this tensile stress will inherently provide the desired circular anisotropy. This method is particularly advantageous since the magnetic anisotropy can be generated as an inherent function of machine assembly, eliminating the need for a prior processing step to establish directional magnetic anisotropy in transducer 4.

Following the introduction of magnetic anisotropy to transducer 4, transducer 4 must be polarized in the desired direction, either clockwise or counterclockwise, about the circumference of transducer 4. Polarizing the transducer 4 (or more generally, the active element) requires the exposure of all portions to a large enough field in the desired circular direction. The required size of the polarizing field is limited by the practical attainment of saturating effects. Use of a larger field does not noticeably change the operation of the properly polarized device. Transducer 4 should be exposed to the field for a sufficient period of time for the desired polarizing effects of the field to take place, for eddy currents to die down, and so that nothing more happens if the field is maintained for a longer time.

In a preferred method, transducer 4 is polarized by rotating it in the field near two opposite magnetic poles, as provided for example by a horseshoe magnet. During the rotation of transducer 4, the magnet is moved radially inward close to transducer 4 (which is continuously rotating during the approach of the magnet) and, after a few rotations to stabilize the effects of the magnet, the magnet is slowly moved away far enough so that it has no further effect on transducer 4 magnetization. The polarity imparted by the magnet in this method will be dependent on the orientation of the poles of the magnet and is independent of the direction of rotation of transducer 4.

Another preferred method of generating a circularly directed field is by the use of electrical currents. For example, a suitable large unidirectional current may be conducted directly through shaft 8, on which transducer 4 is assembled. Alternatively, such a current may be conducted through a coaxial conductor passed through the central hole in transducer 4 prior to its assembly on shaft 8. Further, a conductor passing a current in a single direction can be wrapped helically about the inside and outside of transducer 4 to form an effective row of conductors proximate to each of the inner surface 22 and outer surface 24 of transducer 4. Current flows in opposite axial directions inside and outside transducer 4 produce additive fields in the same circular directions.

Shaft Construction

The construction of shaft 8 is important to the invention in that shaft 8 should not interfere with the operation of the sensor 2. Relevant aspects of shaft construction are disclosed in detail in U.S. Pat. No. 5,351,555, the disclosure of which is incorporated herein by reference.

It is clearly advantageous in the interest of sensitivity to direct as much as possible of the axial flux, which arises from the torque, through the field modulator 25 and the magnetic field vector sensor 6. Shaft 8, field modulator 25 and transducer 4 should be designed to work together to maximize the permeance of flux closure paths through the sensor and field modulator while minimizing the permeance of all parallel paths. Thus, it is important to avoid having high permeability materials either axially or radially proximate to the edges 18 and 20 of transducer 4 and field modulator 25. In general, magnetically permeable material of shaft 8 should not be permitted to create a magnetic path at transducer 4. This limitation can be achieved in several ways. Referring again to FIG. 1, in a preferred embodiment, shaft 8 is constructed of low permeability (i.e. paramagnetic) material and transducer 4 is mounted directly to shaft 8. In another embodiment, shaft 8 is ferromagnetic and a low permeability spacer is disposed between shaft 8 and transducer 4. In a further embodiment, shaft 8 has a substantially smaller diameter in regions proximate to transducer 4 or shaft 8 is entirely cut away in such regions. In either case, a connecting sleeve of low permeability material is provided to bridge the gap created by the cutting away of shaft 8. Transducer 4 is then mounted on the connecting sleeve.

It should be emphasized that proper operation of sensor 2 requires that there be no slippage between any of the components at their interfaces. Each assembly must act as one body over the entire rated torque range. That is, transducer 4 must be attached to the torqued member in such a way that the surface shear strain of their interface is the same on both, i.e., no slip. Somewhat less obvious, but no less important, is the requirement that there be no inelastic strain in shaft 8 in any cross section which includes the transducer 4. Thus, all strains associated with the transmission of torque must be fully recoverable when the torque is relaxed. If slippage on any scale occurs the stress in the transducer 4 will not represent the torque applied to the shaft.

Attachment of Transducer to Shaft

As already indicated, the transducer 4 and underlying shaft must act as a mechanical unit. Rigid attachment of the transducer 4 either directly or indirectly to shaft 8 is crucial to proper operation of transducer 4. In principle, the transducer 4 need only be attached at the two ends for this requirement to be met. The details of transducer/shaft attachment and various methods of achieving suitable attachment are disclosed in detail in U.S. Pat. No. 5,351,555, the disclosure of which is incorporated herein by reference.

Methods of attachment may be classified according to the points of force distribution for the transmission of torque along the shaft. The points of force distribution may be either salient, distributed (areal) or diffuse.

Salient force distribution can be achieved by providing mating surfaces on transducer 4 and shaft 8 having mutually engaging profiles, such as a non-round shaft engaging a matching polygonal or elliptical hole in the transducer 4. Matching internal and external splines, knurls, or teeth can be cut on the inner surface 22 of transducer 4 to mate with similar structures cut onto shaft 8. Teeth can be cut into the edges 18 and 20 of transducer 4, mating teeth can be cut into the ends of two segments of shaft 8, and axial projections provided on the shaft segments to mate with the center hole in transducer 4 such that when transducer 4 is assembled to the two segments of shaft 8, the teeth on the shaft 8 mate with the teeth on the transducer 4 to render the shaft 8 and transducer 4 relatively rotatively immobile. In other embodiments, keys, pins, or even set screws could be used, although these fastening methods are preferred only for less structurally demanding applications.

Distributed transmission of forces can be achieved by friction or adhesive bonding of transducer 4 to shaft 8. The joint is subjected to the same shearing stress as that being transmitted. This bonding limits the maximum measurable torque to a lower value than might otherwise be handled by the shaft 8 alone or transducer 4 alone, but is advantageous for other reasons as indicated previously. Press or shrink fits can be used to obtain the desired circular anisotropy, and can provide very substantial gripping forces which as a practical matter will not be broken by expected torques on shaft 8. With clean, degassed (and perhaps deoxidized) surfaces, the effective coefficient of friction can rise without limit and act somewhat like a weld. There are also some anaerobic adhesives which make tight fits tighter by expanding into microscopic crevices when they harden. If temperature and environmental conditions do not prevent the use of adhesives, adhesives can be used with designs of transducer 4 in which the adhered area is large compared to the cross sectional area of either the transducer 4 or the joint. This can be done by creating transducer 4 from a spirally wrapped strip using interlayer adhesive.

If a transducer ring is attached to a shaft by the friction associated with an interference fit, it is difficult to obtain a homogeneous interference right up to the very ends of the ring. Thus, internal chamfers or radii, tool marks, nicks, etc. prevent the uniform transfer of torque form the shaft to the ring at all portions of the periphery at the precise edge of the transducer ring. Local stresses and local stress gradients associated with these geometric imperfections are manifested by circumferential variation in the field produced by a given torque and a circumferentially variable departure from a truly zero field with zero applied torque. Rather than try for geometric perfection at the ring ends it is more practical to avoid this "end effect" problem by establishing stress free zones, of small axial extent, at each of the ring ends. By making the axial length of these sections large compared to the circumferential variation in location, relative to the plane of either transducer ring end, of the points of first firm contact between the ring and the shaft, these unstressed zones will serve to average out the local field variations. Several methods of accomplishing this include undercutting the shaft to avoid contact at the ring ends, relieving the inside end portions of the ring itself to avoid contacting the shaft, enlarging the outside end portions of the ring to reduce the torque associated stresses therein and adding high permeability, low magnetostriction, (thus stress has no effect) material at the ring ends to homogenize the end effects.

Diffuse force distribution can be achieved using welds or brazing. Welds can obviously be used at the ends or through perforations in the transducer 4. Spot welds or continuous line (seam) welds or welds over parts or all of the transducer 4 area (forge welding) can also be used. The transducer 4 could also be cast around the shaft in a mold, or sprayed (molten condition), explosively welded, electroplated or created by ion implantation or other surface modification of the shaft surface such that the transducer is directly or indirectly attached to or forms a part of the surface of the shaft. Clearly, combinations of these general methods might also be used and might be especially suitable for specific applications.

Thus, the present invention provides an improved method of sensing torque or power on a rotating shaft. In the first step of one preferred form of the method, a transducer 4, according to the present invention, is constructed and attached about the circumference of a machine shaft 8 by one of the methods disclosed previously. Either before attachment or during the process of attachment, as described previously, transducer 4 will be endowed with the required anisotropic magnetic properties, and can be polarized at any time either before or after endowment with anisotropic magnetic properties. A field modulator, such as toothed ring 25, is attached about the circumference of transducer 4 or magnetically contiguous to transducer 4 about the circumference of shaft 8. The shaft 8-transducer 4-field modulator 25 assembly is then installed in the machine. A magnetic field vector sensor 6 according to the invention is installed proximate to transducer 4 with an orientation permitting reception of the modulated, stress-induced magnetic field of transducer 4. In operation of the machine, magnetic field vector sensor 6 then provides a signal linearly indicative of either torque or power on shaft 8, and the signal is monitored by a feedback control or other monitoring circuit connected to magnetic field vector sensor 6. If the magnetic field vector sensor 6 is a solid state sensing device, such as a Hall effect sensor, the output signal is linearly indicative of torque on shaft 8 and is independent of the drift in the quiescent output signal which is typically characteristic of such field sensors. If the magnetic field vector sensor is a coil, the output signal, which is generated by the rotation of shaft 8, is linearly indicative of power transmitted by shaft 8.

It can be seen from the foregoing that the magnetic field created by a thin ring of circumferentially polarized magnetostrictive material is a near perfect linear analog of the torsional stress in the ring. With such a ring rigidly mounted on a shaft, it is only necessary to measure the modulated field in the space near the ring in order to obtain a measure of the torque being carried or power transmitted by the shaft. The absence of any external source of magnetization together with the independence from the characteristic output drifts with temperature of readily available low cost field sensing devices encourages the use of this simple construction for both industrial and automotive torque transducer and power transducer applications. Nonetheless, in some applications, variation in the detected magnetic field arising from changing orientation of the transducer assembly in ambient fields, such as from the earth, or changing proximity to electric motors or magnetized machine parts, can compromise the accuracy of the torque or power indication. Thus, as has been pointed out hereinbefore, practical embodiments of these transducers often require the use of either shielding structures with a concomitant increase in overall size, or active compensation methods which can significantly increase their complexity. In a further embodiment of the present invention there is disclosed a modification of the basic transducer construction which depends only on symmetry to substantially reduce the effect of external sources on the detected field.

In the arrangement of FIG. 5, a field sensor 6 oriented to detect fields in the radial direction is seen to be located near one end of the transducer 4. Common practice is to locate a second (identical) sensor in a diametrically opposite position (e.g., sensor 6b) or in a symmetrical position at the other end of the ring (e.g., sensor 6a). In either case, since the second sensor is in the same plane as sensor 6 and identically oriented, flux generated by the transducer ring 4 passes through it and sensor 6 in opposite directions. On the other hand, ambient fields will generally arise from distant sources and thus be of sufficiently low gradient to have the same direction and approximate intensity at both field sensor locations. Moreover, as long as radially directed fields from outside sources are small compared to the anisotropy field, they will not alter either the direction or orientation of the ring magnetization. Thus, as has already been described hereinbefore, with this arrangement, the difference in the output signals from the two sensors is, to the largest extent, due only to the field generated by the ring itself.

In contrast to its insensitivity to radial fields, the orientation of the magnetization in the ring can be readily affected by an axial magnetic field ($H_a$). While the effects of torque and axial field on detected field are themselves indistinguishable, it has been found that the different dependencies of their respective effects on the direction of the circular magnetization provides a means to separate them.

Figure 7:
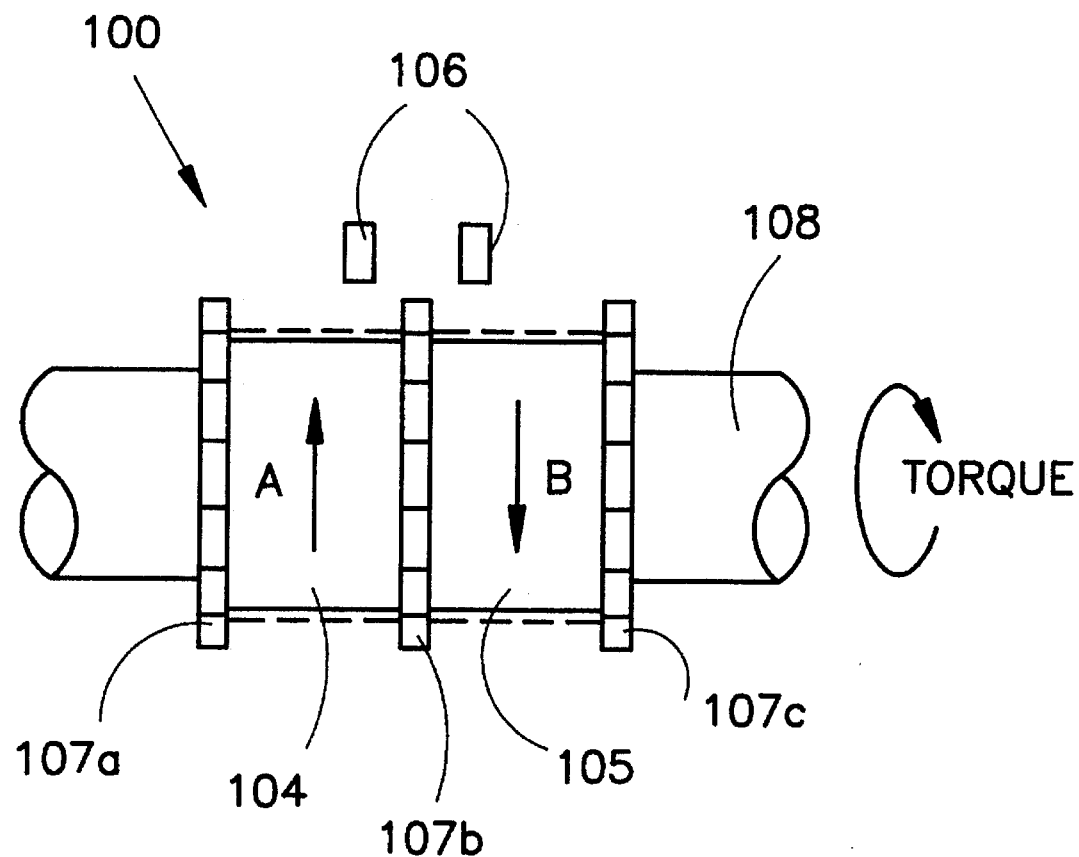
FIG. 7 is an assembly drawing showing the sensor of the present invention utilizing two oppositely polarized transducer rings.

FIG. 7 shows a torque/power sensor construction 100 utilizing two oppositely polarized rings 104, 105 to effectively eliminate any dependence of the detected field on axial fields. In the construction shown, transducer rings 104, 105 are mounted on shaft 108 and field modulating rings 107a,b,c are mounted on transducer rings 104, 105 on the end faces of each transducer ring and at the contiguous faces of the transducer rings, locations where the field intensity is the highest. When using multiple field modulating rings it is important that the teeth on the rings are circumferentially aligned in order to maximize the field modulation amplitude. For this reason it is important that the modulating rings be fixed in angular position in such a manner that relative slippage is avoided. The field modulating rings 107a,b,c, may be conveniently maintained in position by the optional use of non-magnetic spacer rings (shown in phantom). Magnetic field vector sensors 106 are mounted closely adjacent the upper surfaces of the transducer rings on opposite sides of central modulating ring 107b. Particularly when using coils as field sensors, it may be desirable in terms of improving signal strength, to circularly arrange sensing coils in a plane perpendicular to the shaft axis with one coil adjacent each tooth of each modulating ring. Although transducer rings 104, 105 are shown to be abutting, they need not be physically contiguous. It is sufficient if rings 104, 105 are close enough that their individually generated fields can be detected by the same field sensors. When arranged in this manner the rings can be said to be magnetically contiguous.

In this arrangement of torque/power sensor 100, where oppositely polarized rings are magnetically contiguous, the total detected field at the contiguous faces of these rings will be solely dependent on the torque applied to the shaft and will be independent of axial magnetic fields Moreover, the use of two field sensors also provides independence of the transducer output signal from radial fields. Since arbitrary fields from outside sources may have both radial and axial components, this dual ring construction provides an output signal that is substantially independent of all such fields. The configuration and manner of constructing magnetoelastic torque sensors having axially distinct, magnetically contiguous, oppositely polarized circumferential regions is more fully disclosed in copending U.S. application Ser. No. 08/253,022, filed Jun. 2, 1994, the disclosure of which is herein incorporated by reference.

It will be appreciated that this independence from ambient fields greatly attenuates the "magnetic noise" in the output signal of the field sensor, thereby reducing or eliminating the need for bulky and expensive shielding. The attendant increase in signal/noise ratio with this dual ring construction has great significance in the automotive power steering application wherein the signal fields are relatively feeble. If the magnetic noise is low enough, the electrical output signals of the field sensors can be electronically amplified to provide any effective sensitivity desired. This very same effect can be obtained with the rings polarized in the same circular direction if the respective magnetostrictions of the rings have opposite signs. However, considering the very limited number of materials having a suitable combination of magnetic and mechanical properties, this possibility is commercially unlikely.

Not only can two oppositely polarized, magnetically contiguous rings reduce the effects of ambient magnetic fields on indicated torque, but also this result can be achieved with any number of physically separate but functionally cooperating circumferential rings. In addition, it has been found that in lieu of two separate rings, a single ring can be utilized which is divided into two or more oppositely magnetized, axially distinct circumferential regions, with each pair of magnetically contiguous, oppositely polarized regions separated by a domain wall and distinguished by the magnetic field each creates in proximate space when torsionally stressed. The regions may be abutting or may be axially spaced apart with non-polarized circumferential regions therebetween. They may or may not be physically distinct regions and there may or may not be non-destructive ways for determining their respective axial locations or their states of magnetization other than by the application of torsional stress.

Whether the transducer ring is attached to the shaft by an interference fit or by other methods described hereinbefore, such as swaging the ends of a ring over serrations on the shaft, in order to ensure a rigid connection independent of the coefficient of friction or by other mechanical means of attachment (pins, keys, etc.) or even by welding, a problem is that the torsional stress in the ring is inhomogeneous in the area of attachment. Therefore, if the full axial extent of the ring is polarized, the "pole" strength is not uniform around its circumference.

This troublesome effect can be reduced by limiting the polarized regions to portions of the ring that are far enough distant from the attachment areas to not feel their associated stress concentrations. For example, a torque sensor can comprise a single transducer ring attached onto the shaft and having localized, axially distinct, oppositely polarized circumferential regions and non-polarized circumferential end regions, with the areas of attachment, by whatever means, in the non-polarized end regions.

The oppositely polarized circumferential regions need not even be placed on the shaft, for example, by attachment of a transducer ring on the surface of the shaft. Rather, the oppositely polarized regions can form a part of the surface of the shaft. This concept of local polarization is not limited to the establishment of two polarized regions but may be used to construct torque sensors having more or less than two (e.g., 1, 3, 4) polarized regions. Likewise, the notion is equally applicable to rings formed of separate pieces, to single rings on which multiple regions are formed and to any of the methods hereinbefore described for establishing a magnetoelastically active region on or forming a part of the surface of the shaft.

In this connection the term "on" the surface of the shaft includes any surface of the shaft and, specifically, the inner diametric surface of a tubular shaft. For example, a transducer ring having a negative magnetostriction, e.g., nickel, high nickel alloys, many ferrites, and the like, may be pressed into the opening of a tubular shaft to form an interference fit with the inner diametric surface, whereby the compressive "hoop" stress resulting from such an inverted configuration achieves the desired circular anisotropy in the ring. The field modulator would have to be similarly mounted and the magnetic field sensor would be mounted in such a way as to protrude into the hollow ring to wherever the poles form. Such a construction would facilitate the measurement of torque transmitted to or from a pulley (or sprocket or gear) mounted near the end of a shaft and would be useful at the end of motor shafts, for example.

Where there are two magnetically contiguous, oppositely polarized, axially distinct circumferential regions, as can be seen from FIG. 7, the preferred location for the field modulator is where the flux is strongest. Thus, if a single modulating ring were used, it would preferably be located at the domain wall between or the contiguous faces of the two oppositely polarized regions. More desirably, when three (3) modulating rings are employed, as shown in FIG. 7, the two additional modulating rings are positioned at the free ends of the regions. This arrangement allows the modulating rings to more effectively create flux bundles between the free ends and contiguous ends of the oppositely polarized regions. Locating the modulating rings only at the free ends could not be as advantageous an arrangement since the flux is not as strong at the free ends as at the contiguous ends and because the field at the free ends is not free of ambient field effects. The field sensors are preferably located on opposite sides of the domain wall between, or the contiguous faces of, the two oppositely polarized regions. However, in many cases it is difficult to precisely position the field sensor or to identify the precise location of the domain wall. In some applications the shaft moves axially due to bearing clearances, thermal expansion, and the like, thus upsetting even the most carefully aligned field sensor. By use of more than two polarized regions, it has been found that the required accuracy of alignment of the shaft/ring assembly and the sensor assembly can be reduced.

Turning now to methods of polarizing the various domains, it will be appreciated that if separate transducing rings are used for each domain, then each transducing ring may be polarized before it is assembled on the shaft. This "prepolarizing" can be done using any of the methods hereinbefore taught. If two or more locally polarized regions are to be instilled into a single ring (either separate from the shaft physical entity or a functionally equivalent, bandlike portion of the shaft itself) then not all of these methods are viable. The choice of polarizing method will depend on many factors, e.g., whether the ring is already assembled to the shaft, the physical sizes of the ring and the shaft and whether a single torque transducer is to be made or many transducers are to be mass produced. Whatever the specific choice of method, there are two general modes of polarizing any one circumferential region, i.e., all at once or sequentially.

Figure 8:
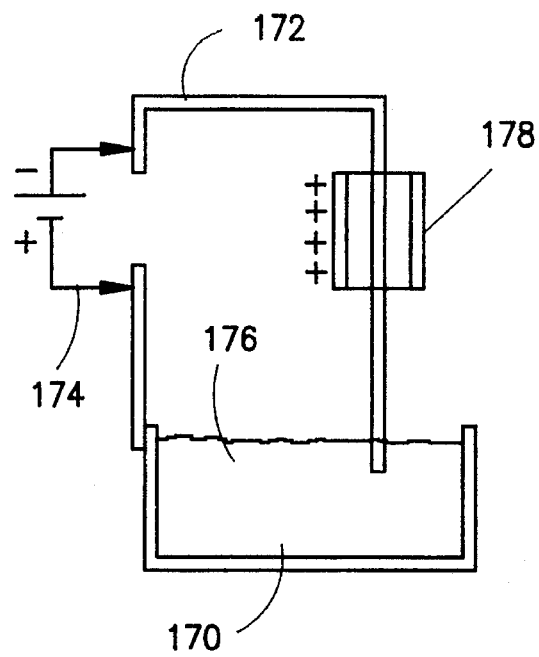
FIG. 8 illustrates the apparatus for and a first step in a method of creating multiple, oppositely polarized, contiguous circumferential regions in a ring.
Figure 9:
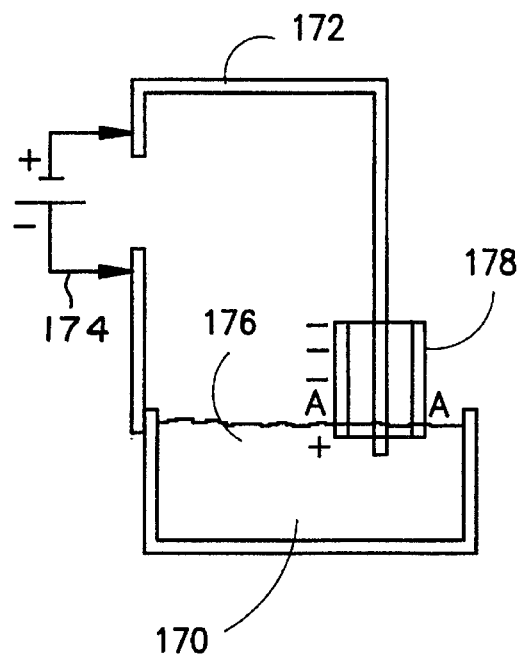
FIG. 9 illustrates a further step in the method of FIG. 8.
Figure 10:
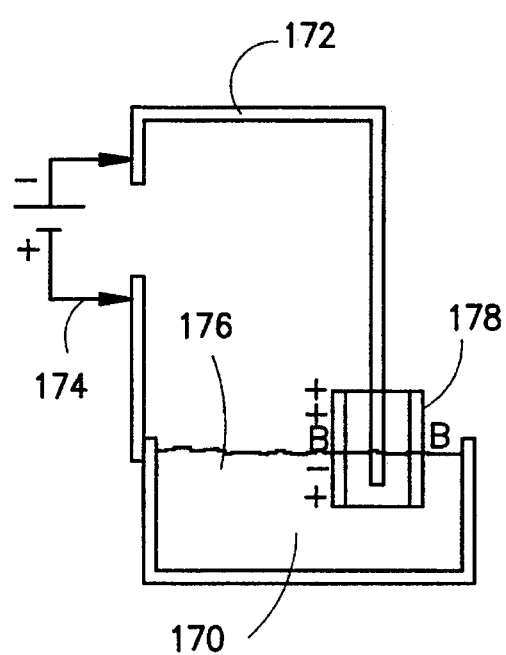
FIG. 10 illustrates a still further step in the method of FIG. 8.
Figure 11:
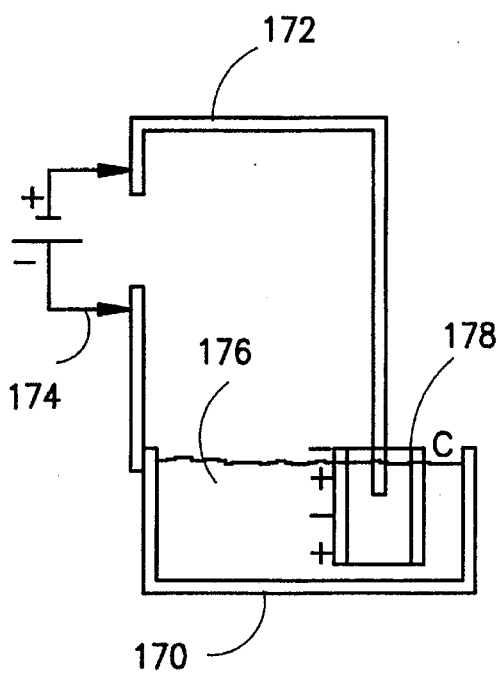
FIG. 11 illustrates the final step in the method of FIG. 8.
Figure 12:
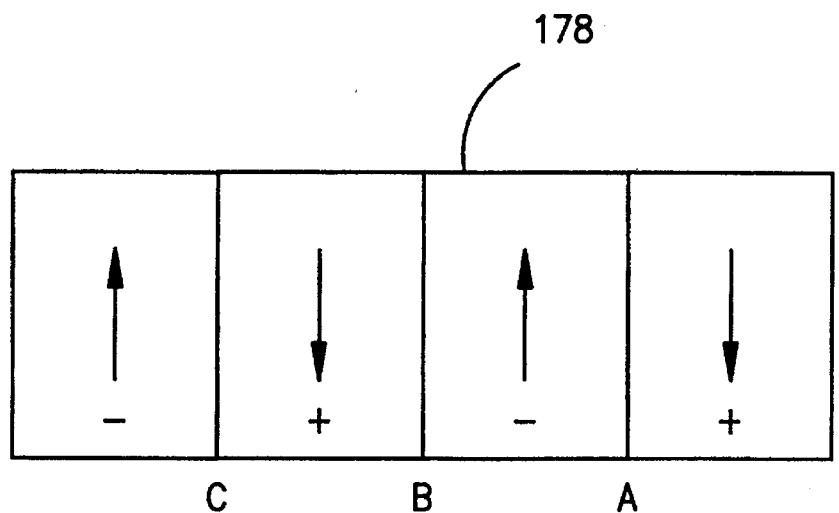
FIG. 12 illustrates the ring produced by the method of FIGS. 8–11.

Polarizing the entire circumference all at once is accomplished by the passage of an electrical current either through the shaft itself or through a coaxial conductor threaded through the ring. An example of how multiple, oppositely polarized, contiguous circumferential regions may be created in a ring by this method is illustrated in FIGS. 8, 9, 10 and 11 and explained hereinafter. With reference to FIG. 8, a conductive container 170 is electrically connected via conductor 172 and d.c. power source 174 to a conductive liquid 176 within the conductive container 170. The conductor 172 passes coaxially through ring 178 which, initially, is supported out of contact with conductive liquid 176. With the polarity of d.c. source 174 arranged as indicated, upon current flow through conductor 172 the entire axial length of the ring is polarized in a first direction (indicated as +). In a second step, shown in FIG. 9, ring 178 is immersed in conductive liquid 176 up to circumferential position A, the polarity of d.c. source 174 is reversed, and a current pulse is made to flow through the conductor 172, conductive liquid 176 and centrally through those portions of the ring 178 not immersed in the conductive liquid. In this manner, the polarity in those portions of the ring 178 in which the current is flowing, i.e., those portions of the ring 178 not immersed in the conductive liquid 176, is reversed (indicated as −). In a third step, shown in FIG. 10, the ring 178 is further immersed in conductive liquid 176 up to circumferential position B. The polarity of d.c. source 174 is again reversed and again current is made to flow centrally through those portions of the ring not immersed in the conductive liquid to again reverse the polarity in the non-immersed portions (indicated as +). In a final step, shown in FIG. 11, the ring 178 is still further immersed in conductive liquid up to circumferential portion C. The polarity of d.c. source 174 is again reversed and again current is made to flow through the non-immersed portions of the ring to reverse the polarity in those portions (indicated as −). The resulting polarized ring 178, shown in FIG. 12, comprises four contiguous, axially distinct, oppositely polarized circumferential regions separated by domain walls A, B, C.

In like manner, any desired number of circumferential, oppositely polarized regions may be created in ring 178. If it is desired to interpose a non-polarized band between any of the regions, or at the ends of the ring, these can be created by positioning the ring as in any of FIGS. 8–11 and passing a damped alternating current through conductor 172 in order to "non-polarize" the non-immersed portions of the ring.

Figure 13:
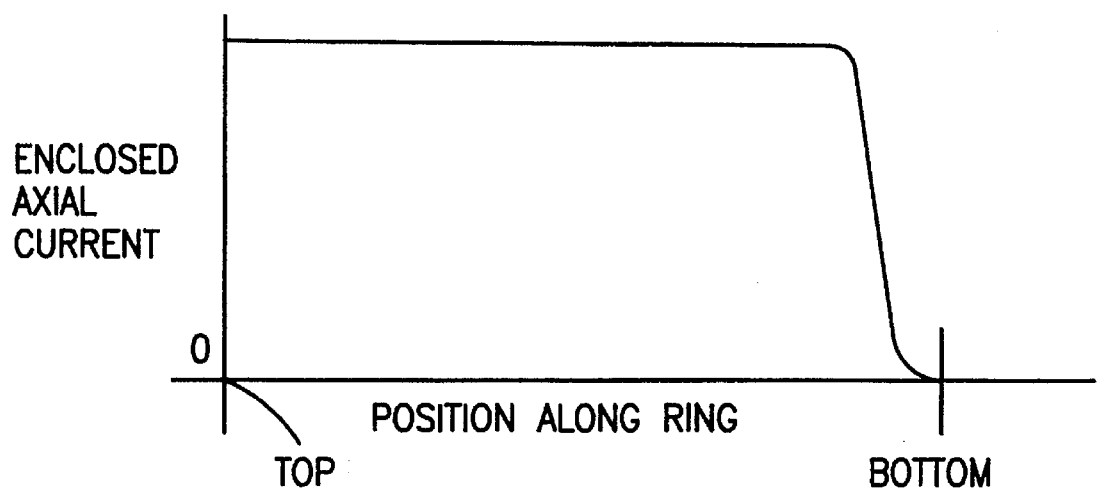
FIG. 13 illustrates the graphical relationship between enclosed current and position along the ring for the method and apparatus of FIG. 9.

The conductive liquid may be mercury, molten Wood's metal, or the like or need not be an actual liquid. Rather, it may be, for example, a fluidized bed of a finely divided conductive solid, e.g., copper, aluminum or graphite. If the shaft isn't inconveniently long the above described method can also be used to create multiple domains in a ring that is already assembled onto a shaft. Instead of a liquid, the shaft may be "immersed' in a conductive tube fitted with spring fingers encircling the ring and making good electrical contact over substantially the entire ring circumference. The idea, of course, is to prevent the conducted current from flowing (coaxially) within the ring in those portions wherein no further polarization is desired. Once the current enters the region where the ring is no longer the outermost conductor it spreads radially, diffusing over the entire conductive area. The magnetizing field acting at any radius within the ring is directly proportional to the axial current enclosed. ($H=0.2$ I/r where H is the field in Oersteds, I the enclosed current in amperes and r the radius in centimeters.) Consider the graphical illustration shown in FIG. 13 of enclosed current vs position along the ring for the circumstance shown in FIG. 9. A short distance below "A" the magnetizing field due to the enclosed current becomes less than the coercive force of the ting material and is thus unable to reverse the magnetization in these (immersed) portions of the ring.

Polarizing the entire circumference sequentially requires rotation of the ring while each region (or portion thereof) being polarized is subjected to a local field having the required polarity. One, some, or all of the regions can be polarized simultaneously in this manner. Either electric currents or permanent magnets can be used as the source(s) of the local field(s), as is shown in FIGS. 14, 15 and 16.

With reference to FIG. 14, ring 180 is mounted on shaft 182 in any manner described hereinbefore. Conductor 184 is arranged in optional yoke 186 adjacent ring 180 in such a manner that current flows in opposite directions in the portions of conductor 184 adjacent ring regions AB and CD than adjacent ring region BC. In this manner, as ring 180 and shaft 182 are caused to rotate in one direction, opposite polarizing fields arise in ring regions AB and CD as compared to ring region BC. After several rotations the contiguous regions are oppositely polarized. The same result is achieved in the arrangement illustrated in FIG. 15 wherein permanent magnets 190, 192, 194 are arranged adjacent ring regions AB, BC and CD, respectively. The polarities of magnets 190 and 194 are arranged identically and oppositely to the polarity of magnet 192 such that, as ring 180 and shaft 182 are caused to rotate in one direction and the magnets are simultaneously withdrawn (or keepers are inserted across the poles) ring regions AB and CD become oppositely polarized compared to ring region BC. A similar result is achieved in FIG. 16 wherein ring 200 is mounted on shaft 202 and magnets 204 and 206 are arranged on diametrically opposite sides of ring 200 adjacent ring regions AB and BC, respectively. For descriptive simplicity only two regions are shown for ring 200 although, it will be appreciated, any number of regions can be formed along the ring. The polarities of magnets 204 and 206 are similarly arranged. However, due to their respective positioning on opposite sides of ring 200, as ring 200 and shaft 202 are caused to rotate in one direction and the magnets are simultaneously withdrawn (or keepers are inserted across the poles), ring regions AB and BC become oppositely polarized.

Experimental Results

The advantages of the torque/power sensor of the present invention has been demonstrated experimentally. A torque/power sensor was constructed and tested under various conditions of torque and rotational speed using both Hall effect and coil type field sensors. A 203 mm long shaft of 303 stainless steel and a 17.5 mm long transducing ring of 18% Ni maraging steel were provided with matching tapers in the bore of the ring and centrally on the mating surface of the shaft to simplify attainment of an assembly having a controlled interference fit. In this case the ring was axially pressed 5 mm (from the hand tight position) onto the stainless steel shaft. The resulting contact pressure at their interface provided sufficient friction for the ring and shaft to act as a mechanical unit while the tensile hoop stress in the ring established the circumferential direction as the magnetic "easy axis". Though the ring was physically a single piece it was effectively divided into two magnetically distinct regions, A and B, by polarizing each axial half in respectively opposite circumferential direction. Simultaneous polarization of both regions was accomplished by rotation past an assembled pair of oppositely poled electromagnets. This "dual region" design was chosen to avoid possibly troublesome effects from the relatively strong (>10 Oe at the highest levels of torque) magnetic fields created by the dynamometer used in this demonstration.

Three modulator rings, formed of 78 Permalloy, annealed in hydrogen for 1 hour at 1100° C., as shown in FIGS. 3(c) and 3(d), were affixed, by light press fits, one at each end and one in the center of the magnetically active ring. The circumferentially aligned modulator rings were accurately located and held square to the shaft axis by means of stainless steel spacer rings fitting closely over the transducer ring. The assembled field generating portion of the transducer is illustrated in FIG. 7.

Each region A and B in this figure effectively comprises a separate field generating region. Since the transducer ring is oppositely polarized in the two regions, under an applied torque, oppositely directed fields arise in the two axial spaces between an end and the center modulator rings. Two field sensors mounted to the frame of the experimental set-up were inserted in these spaces as indicated in FIG. 7. Connecting these sensors to sense the differential field in these two spaces eliminated effects of fields from other sources (e.g., those from the dynamometer) having the same direction in each space.

The shaft was driven by a nominally 1.5 HP-2300 RPM DC shunt motor with the transmitted power absorbed in a water cooled eddy current dynamometer (Borhgi & Saveri Model FA 100/30 SL). The reaction torque developed on the dynamometer casing was measured with a load cell (Interface Model SSM 500) calibrated with weights on a measured lever arm. Rotational speed was indicated directly in RPM using a digital frequency meter displaying the count of electrical pulses generated in one second (i.e., hertz) by the teeth on a 60 tooth steel gear passing a magnetic proximity sensor. Two Hall effect integrated circuit field sensors (Allegro type 3506 UA) or two coils (to be described hereinafter), mounted on small circuit boards, were used to sense the generated field.

Figure 17:
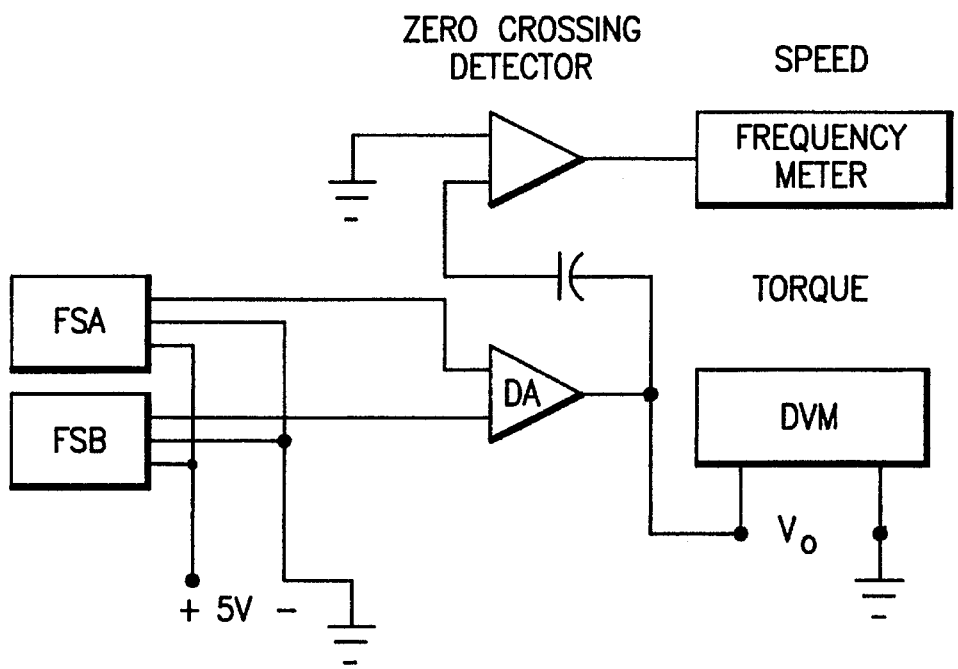
FIG. 17 is a diagram showing an exemplary electrical circuit for extracting and displaying torque and speed information from Hall sensor output signals.
Figure 18:
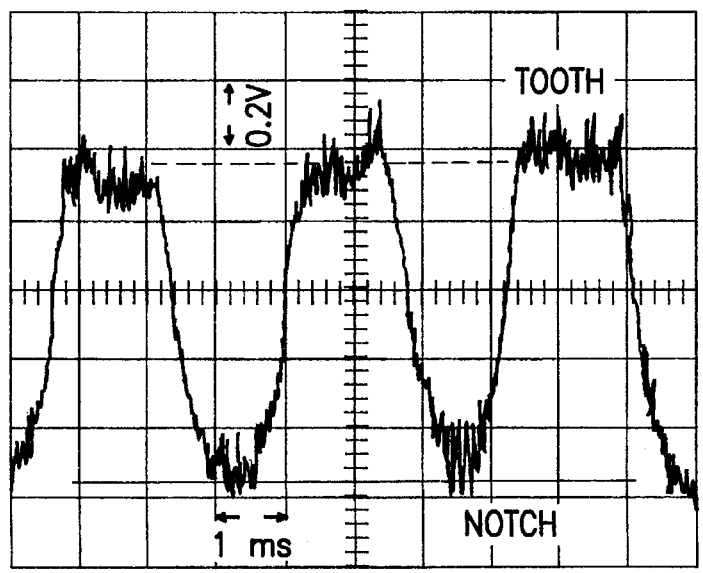
FIG. 18 is an oscillogram of a typical signal appearing across the output terminals of the differential amplifier in FIG. 17.

The electrical circuit used for extracting and separately displaying the torque and speed information from the Hall sensor output signals is schematically shown in FIG. 17. An (ac coupled) oscillogram of a typical signal appearing across the output terminals of the differential amplifier ($V_o$ in FIG. 17) is shown in FIG. 18. The effectiveness of the modulator rings in creating a periodic variation in the magnitude of the sensed field is clearly evident. The relatively flat and prolonged peaks representing the sensed field opposite a tooth suggests that a modulator ring having narrower teeth and wider intertooth spaces would provide a signal having a greater peak to peak amplitude for the same torque.

Figure 19:
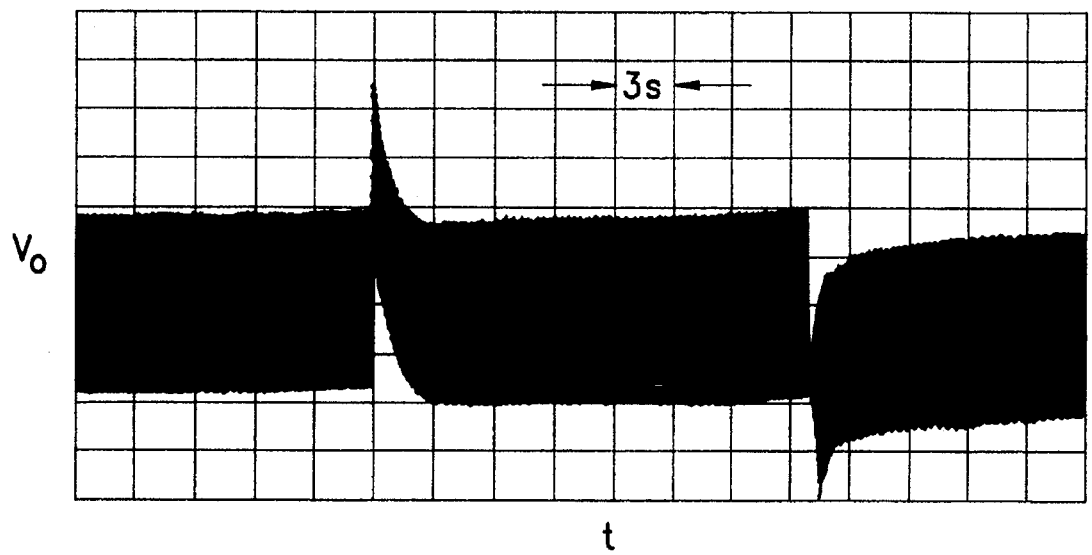
FIG. 19 is a chart recording of the transient variations in output signal when Hall sensors are rapidly cooled.

The chart recording in FIG. 19 shows, for conditions of fixed torque and rotational speed, the transient variations in $V_o$ when first one Hall sensor and then the other was rapidly cooled by a momentary spray of a liquid refrigerant (chlorodifluoromethane). The dramatic changes in $V_o$ seen in this recording resulted from the "thermal drift" in $QV_o$ of the sprayed sensor. While it is not likely that such steep thermal gradients would exist in any practical application, the allowable variation in $QV_o$ of any one Hall sensor over the rated temperature range is itself comparable to the intensity of the field created by the transducing ring under rated torque. On the other hand, since the nominal variation of sensitivity (S in equations (3)–(6)) was designed to be −0.02%/°C., individual variations in S will expectedly have a far smaller (and if required, a more easily compensated) effect on $V_o$. What is most dramatic is the lack of visible change in the peak to peak signal (top to bottom of darkened band) throughout the entire recording period shown in FIG. 19, which attests to the usability of Hall sensors, in spite of their propensity for thermal drifts, to provide a reliable measure of torque by simply separating out the amplitude of the field modulation.

Figure 20:
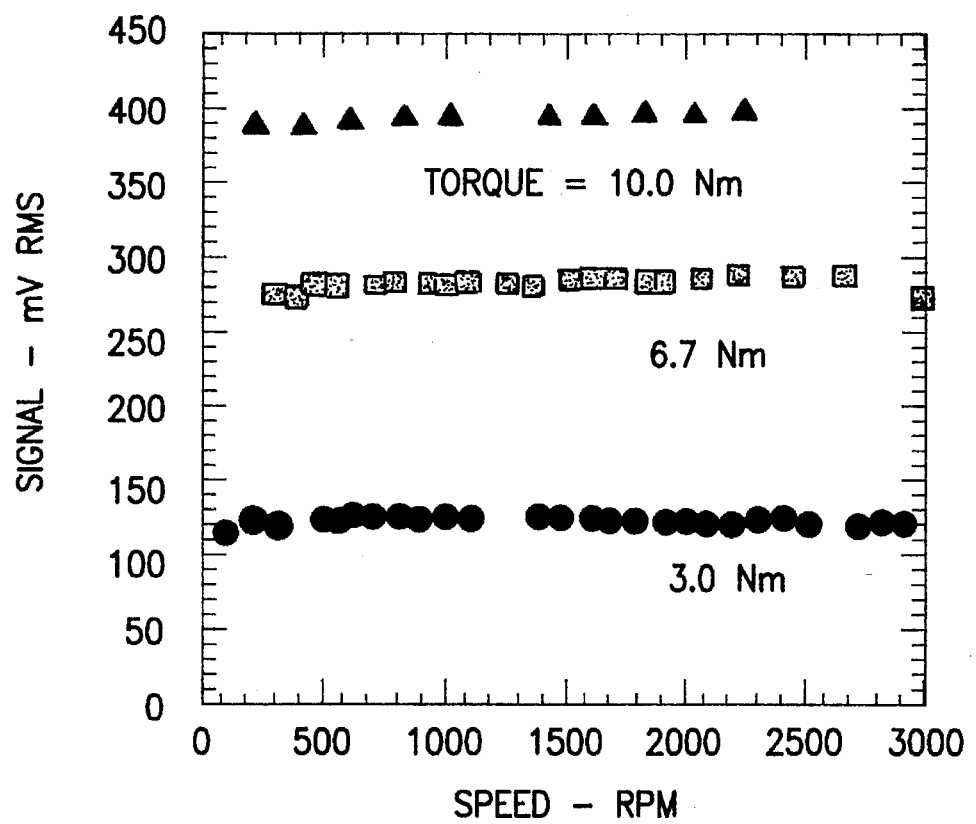
FIG. 20 is a graph of the rms value of the output signal at three fixed values of torque as a function of rotational speed.

Measurements of the rms value of the output signal (Voac) at three fixed values of torque are plotted against rotational speed in FIG. 20. It is noteworthy that the output signal was substantially constant, subject to explainable measurement errors, indicating that the output signal is a nearly perfect analog of the shaft torque over a wide range of shaft speeds and torques.

Figure 21:
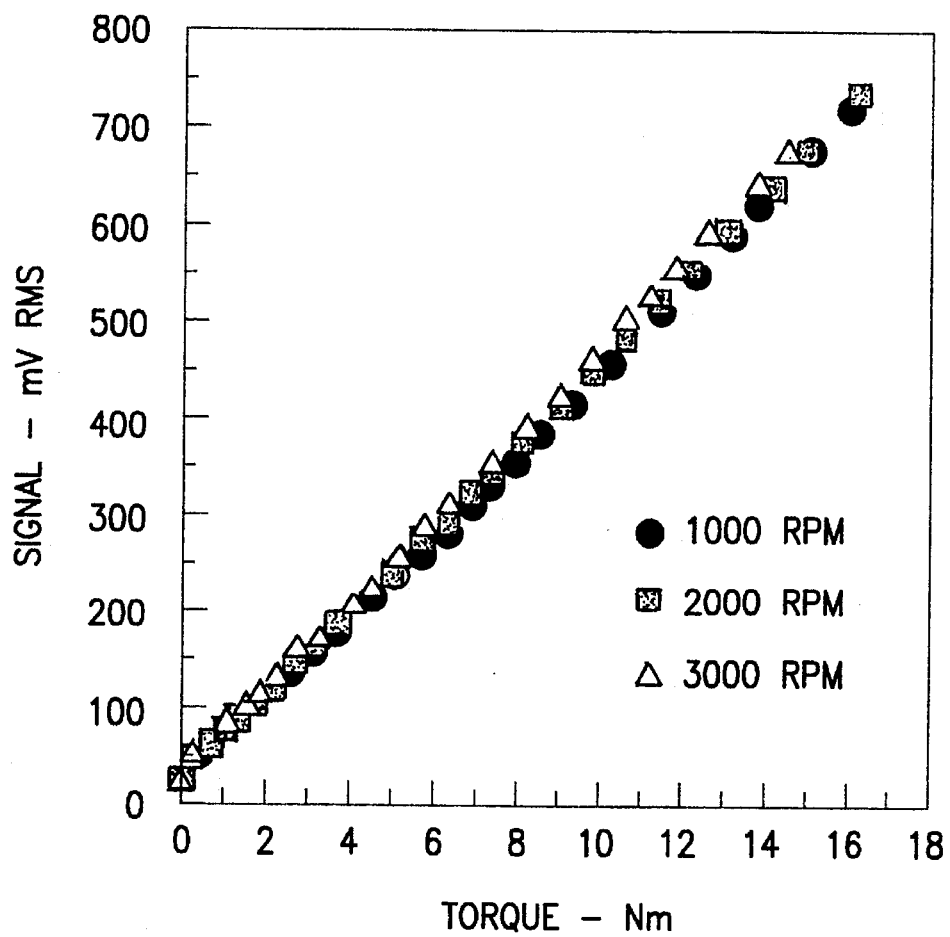
FIG. 21 is a graph of output signal as a function of applied torque for three values of rotational speed.

The data plotted in FIG. 21 indicates the expected linear variation in output signal with torque. The small signals seen to be present at zero torque represent both circuit noise and drag torque. Subject to explainable measurement error this plot is a highly accurate linear correlation indicating that the output signal accurately indicates shaft torque irrespective of shaft speed.

Figure 22:
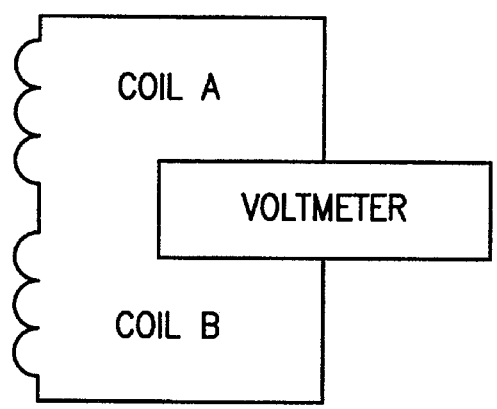
FIG. 22 illustrates the measuring circuit for displaying power information from coil sensor output signals.

Power measurements were made using two small coils, instead of the Hall effect devices, as field sensors. Each coil core was made from a mixture of Permalloy powder and epoxy. The winding consisted of 1000 turns of polynylon insulated #40 AWG wire. The measuring circuit, as can be seen from FIG. 22, was comprised solely of a voltmeter and series connected coils. Since the signals were directly generated in the coils, no electronics were needed other than were contained within the digital voltmeter.

Figure 23:
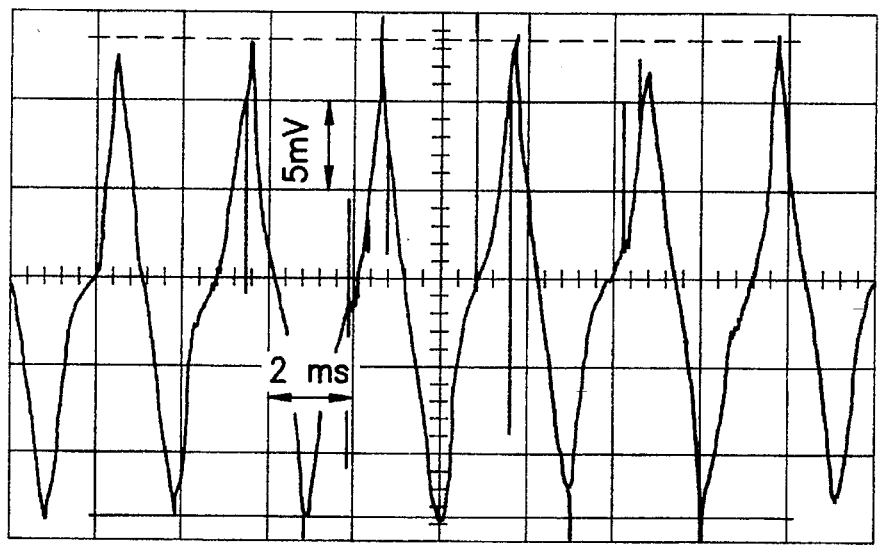
FIG. 23 is an oscillogram of typical power output signals.

FIG. 23 is an oscillogram of typical output signals. The waveshape should be recognized as the time derivative of the (inverted) waveform shown in FIG. 18, as expected frown consideration of equation (9). Since the period of the wave seen in FIG. 23 is the time between passages of successive teeth on the modulator rings, six such periods represent the time for a single rotation of the shaft. Hence, FIG. 23 indicates that the shaft rotates once each 18 ms, i.e., at 3300 RPM.

Figure 24:
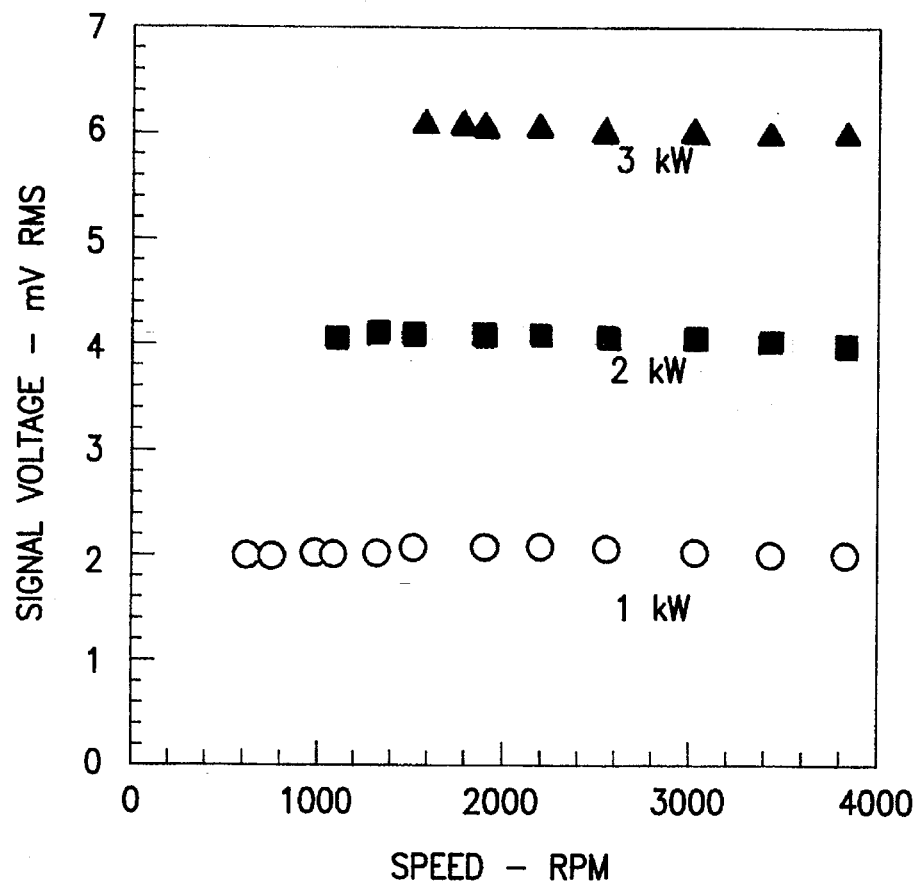
FIG. 24 is a plot of power output signal as a function of shaft rotational speed for three fixed levels of output power.
Figure 25:
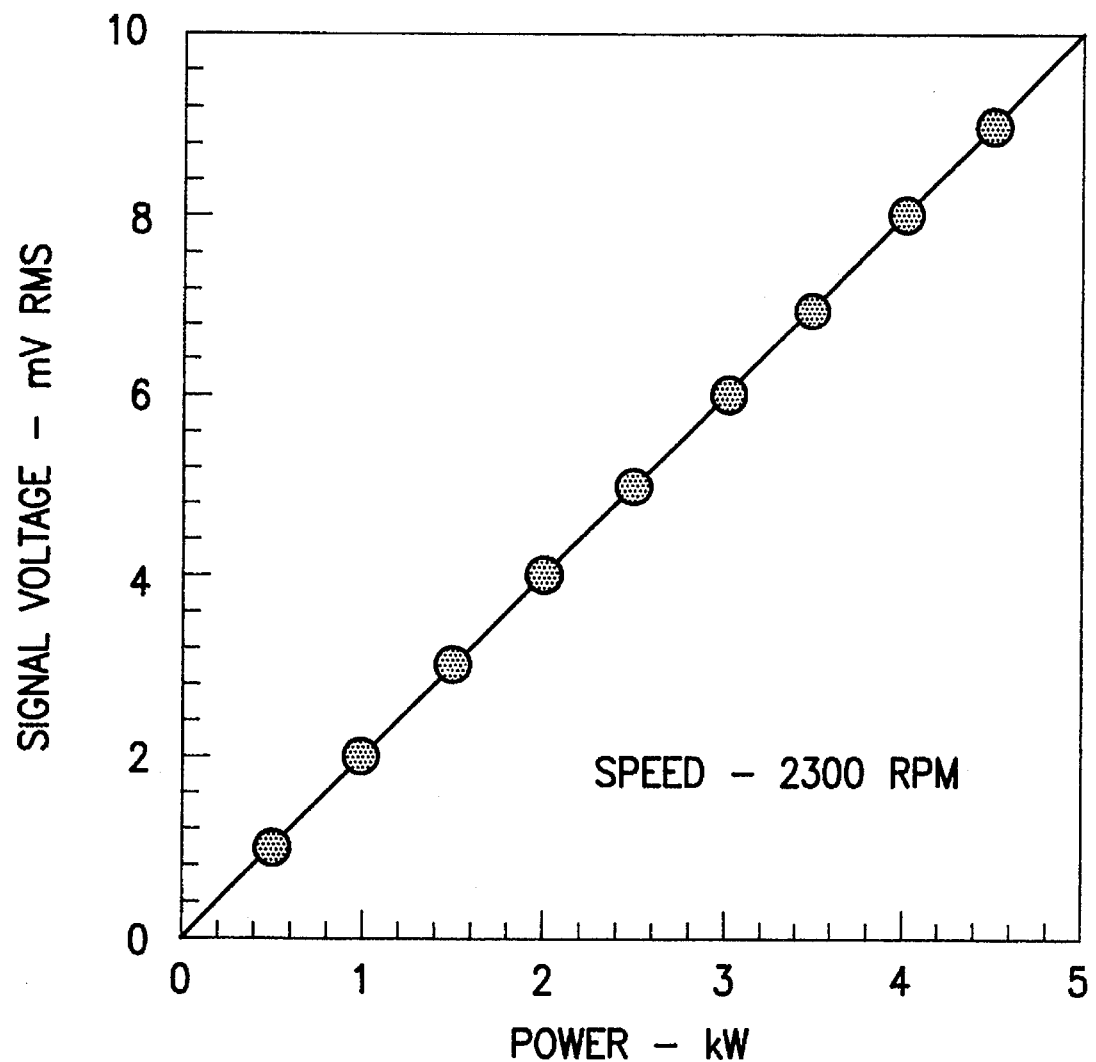
FIG. 25 is a plot of power output signal as a function of transmitted power at constant shaft speed.

FIG. 24 shows the relative constancy of the output signals over wide speed ranges at three fixed levels of transmitted power. The imperfect flatness of these data sets reflects explainable measurement error. The data plotted in FIG. 25 shows that the linear variation in output signal with transmitted power at constant speed, predicted by equation (11), is closely realizable even with this unshielded experimental transducer.

I claim:

1. A magnetoelastic power sensor for providing an output signal indicative of the power transmitted by a rotating torque member about an axially extending axis of said member, comprising:

a magnetoelastically active element comprising ferromagnetic, magnetostrictive transducer means directly or indirectly attached to/or forming a part of the surface of said member in such a manner that torque applied to said member is proportionally transmitted to said element;

said magnetoelastically active element being endowed with an effective uniaxial magnetic anisotropy having the circumferential direction as the easy axis and magnetically polarized in a circumferential direction, whereby, when torque is applied to said member, said magnetoelastically active element produces a magnetic field varying with said torque;

field modulating means formed of magnetically soft material for modulating said magnetic field in a periodic manner indicative of the speed of member rotation, said field modulating means being supported to rotate as a unit with said shaft, and magnetic field sensor means mounted proximate to said magnetoelastically active element and oriented with respect thereto for sensing the amplitude of the time rate of change of said modulated magnetic field and providing a power-indicative output signal in response thereto.

2. The power sensor of claim 1 wherein said field modulating means is directly or indirectly attached to said magnetoelastically active element.

3. The power sensor of claim 1 wherein said field modulating means is directly or indirectly attached to said member at a location which is magnetically contiguous with said element.

4. The power sensor of claim 1 wherein said field modulating means comprises a ring having a uniformly spaced salient feature around its periphery.

5. The power sensor of claim 3 wherein said salient feature is uniformly spaced gear-like teeth.

6. The power sensor of claim 4 wherein said field modulating means comprises two or more axially spaced apart rings, the corresponding salient features on each said ring being circumferentially aligned.

7. The power sensor of claim 1 wherein said transducer means comprises a ferromagnetic, magnetostrictive transducing layer at the surface of said member.

8. The power sensor of claim 1 wherein said transducer means comprises a region of the surface of said member.

9. The power sensor of claim 1 wherein said transducer means comprises at least one tubular ring having opposite end faces and an axially extending circumferential portion therebetween.

10. The power sensor of claim 9 wherein said transducer means comprises two or more axially distinct, magnetically contiguous, circumferential regions which are oppositely polarized in a circumferential direction.

11. The power sensor of claim 10 wherein said transducer means comprises a ring for each circumferential region.

12. The power sensor of claim 10 wherein said transducer means comprises one ring containing said circumferential regions, each pair of contiguous regions being separated by a domain wall.

13. The power sensor of claim 9 wherein said sensor means is positioned proximate at least one end face of said ring.

14. The power sensor of claim 11 wherein said sensor means is positioned proximate the contiguous end faces of said contiguous rings.

15. The power sensor of claim 12 wherein said sensor means is positioned proximate the domain walls between said regions.

16. The power sensor of claim 9 wherein said ring is attached coaxially with and about the surface of said member.

17. The power sensor of claim 16 wherein said ring is attached to said member through an interference fit between the inner diameter of said ring and the outer diameter of said member.

18. The power sensor of claim 17 wherein said inner diameter of said ring is tapered and the outer diameter of said member is correspondingly tapered.

19. The power sensor of claim 17 wherein the inner diameter of said ring is smaller than the outer diameter of said member at the area of attachment therebetween.

20. The power sensor of claim 1 wherein said member is formed of a low permeability material.

21. The power sensor of claim 1 including low permeability spacing means for spacing said member from said magnetoelastically active element.

22. The power sensor of claim 12 wherein said transducer means further includes unpolarized circumferential regions positioned at the axial ends of the ring.

23. The power sensor of any of claims 1, 4, 8, 10, 13, 17 or 18 wherein said magnetic field sensor means comprises a coil and said output signal is indicative of the power transmitted by said rotating member.

24. A method of sensing the power transmitted by a rotating torqued member extending in an axial direction, comprising the steps of:

(a) providing a magnetoelastically active ferromagnetic magnetostrictive element endowed with an effective uniaxial magnetic anisotropy having the circumferential direction as the easy axis and which is magnetically polarized in a circumferential direction, said element being directly or indirectly attached to or forming part of the surface of said torqued member such that torque applied to the member is proportionally transmitted to said element;

(b) producing a magnetic field as a consequence of the application of torque to said member;

(c) modulating the torque-created magnetic field in a periodic manner, the period being indicative of the speed of member rotation; and (d) sensing, at a position proximate to said magnetoelastically active element, the amplitude of the time rate of change of said modulated magnetic field as an indication of the power transmitted by said member.

25. The method of claim 24 wherein said magnetoelastically active element is attached about the circumference of said member.

26. The method of claim 25 wherein said magnetoelastically active element is attached to said member via an interference fit.

27. The method of claim 26 wherein said interference fit is produced by forcing onto the outer surface of said member a tubular magnetoelastically active element having an inner diameter smaller than the outer diameter of said member.

28. The method of claim 26 wherein said interference fit is produced by tapering the outer surface of said member and forcing onto said tapered outer surface a tubular magnetoelastically active element having a corresponding taper on its inner diameter.

29. The method of claim 24 wherein step (d) is accomplished at least in part by positioning a magnetic field sensing device proximate to and spaced from said magnetoelastically active element.

30. The method of claim 24 wherein said element comprises two or more axially distinct, magnetically contiguous circumferential regions which are oppositely polarized in a circumferential direction and separated by a domain wall between each contiguous pair of regions.

31. The method of claim 30 wherein said element comprises two circumferential regions and step (d) is accomplished by positioning a magnetic field sensing devices proximate and on opposite sides of the domain wall between said contiguous regions.

32. The method of claim 30 wherein said element comprises two or more axially aligned, magnetically contiguous rings.

33. The method of claim 30 wherein said element comprises a ring for each circumferential region.

34. The method of claim 30 wherein said element comprises one ring containing said circumferential regions.

35. The method of claim 24 wherein said modulating step comprises providing field modulating means formed of magnetically soft material directly or indirectly attached to said element or to said member at a location which is magnetically contiguous with said element in such a manner that said field modulating means rotates as a unit with said shaft.

36. The method of claim 35 wherein said field modulating means comprises at least one ring having a uniformly spaced salient feature around its periphery.

37. The method of claim 36 wherein said modulating step comprises providing two or more field modulating rings with the corresponding salient features on each said field modulating ring circumferentially aligned.

38. The method of any of claims 24, 25, 28, 30, 35 or 36 wherein said sensing step is accomplished by positioning coils proximate to and spaced from said element and sensing the amplitude of the time rate of change of said modulated magnetic field therewith.

* * * * *

UNITED STATES PATENT AND TRADEMARK OFFICE
CERTIFICATE OF CORRECTION

PATENT NO. : 5,591,925
DATED      : January 7, 1997
INVENTOR(S) : Ivan J. GARSHELIS It is certified that error appears in the above-identified patent and that said Letters Patent is hereby corrected as shown below:

On the title page, item [54] and col. 1, the title should read:

--CIRCULARLY MAGNETIZED NON-CONTACT POWER SENSOR AND METHOD FOR MEASURING POWER USING SAME--.

Signed and Sealed this

Twenty-fifth Day of March, 1997

*Attest:*

BRUCE LEHMAN

*Attesting Officer*     *Commissioner of Patents and Trademarks*